(12) United States Patent
Imahayashi et al.

(10) Patent No.: US 8,049,208 B2
(45) Date of Patent: Nov. 1, 2011

(54) ORGANIC SEMICONDUCTOR DEVICE HAVING COMPOSITE ELECTRODE

(75) Inventors: Ryota Imahayashi, Atsugi (JP); Shinobu Furukawa, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 180 days.

(21) Appl. No.: 11/887,650

(22) PCT Filed: Apr. 19, 2006

(86) PCT No.: PCT/JP2006/308679
§ 371 (c)(1),
(2), (4) Date: Oct. 1, 2007

(87) PCT Pub. No.: WO2006/126363
PCT Pub. Date: Nov. 30, 2006

(65) Prior Publication Data
US 2009/0134383 A1 May 28, 2009

(30) Foreign Application Priority Data

Apr. 22, 2005 (JP) .................................. 2005-125811
Apr. 25, 2005 (JP) .................................. 2005-125904

(51) Int. Cl.
*H01L 29/08* (2006.01)
*H01L 35/24* (2006.01)
*H01L 51/00* (2006.01)
*H01L 23/58* (2006.01)

(52) U.S. Cl. .................. 257/40; 257/647; 257/E51.024; 257/E51.049; 257/E51.051; 438/4

(58) Field of Classification Search .................. 257/40
See application file for complete search history.

(56) References Cited

U.S. PATENT DOCUMENTS
4,981,768 A * 1/1991 Monbaliu et al. .......... 430/58.6
(Continued)

FOREIGN PATENT DOCUMENTS
EP 1398840 A 3/2004
(Continued)

OTHER PUBLICATIONS

Hill, I. G. et al., "Energy-level alignment at interfaces between metals and the organic semiconductor 4-4'-N,N'—dicarbazolyl-biphenyl," 1998, Journal of Applied Physics, vol. 84, No. 6, pp. 3236-3241.*

(Continued)

*Primary Examiner* — N Drew Richards
*Assistant Examiner* — Michael Jung
(74) *Attorney, Agent, or Firm* — Eric J. Robinson; Robinson Intellectual Property Law Office, P.C.

(57) ABSTRACT

It is an object of the present invention, in a case of using a conductive material as part of an electrode for an organic transistor, to provide an organic transistor having a structure whose characteristics are not controlled by the work function of the conductive material. Moreover, it is other objects of the present invention to provide an organic transistor having favorable carrier mobility and to provide an organic transistor which is excellent in durability. A composite layer containing an organic compound and an inorganic material is used for an electrode for an organic field effect transistor, that is, at least part of one of a source electrode and a drain electrode in the organic field effect transistor.

20 Claims, 17 Drawing Sheets

U.S. PATENT DOCUMENTS

| | | | |
|---|---|---|---|
| 5,487,953 A * | 1/1996 | Shirota et al. | 428/690 |
| 6,486,601 B1 | 11/2002 | Sakai et al. | |
| 6,589,673 B1 | 7/2003 | Kido et al. | |
| 6,951,694 B2 | 10/2005 | Thompson et al. | |
| 7,158,161 B2 | 1/2007 | Gyoutoku et al. | |
| 7,387,904 B2 | 6/2008 | Saito et al. | |
| 7,462,883 B2 | 12/2008 | Kumaki et al. | |
| 7,521,855 B2 | 4/2009 | Sakata et al. | |
| 7,545,840 B2 | 6/2009 | Yukawa | |
| 7,560,735 B2 | 7/2009 | Furukawa et al. | |
| 7,605,534 B2 | 10/2009 | Yamazaki et al. | |
| 7,626,198 B2 | 12/2009 | Hirakata et al. | |
| 7,649,197 B2 | 1/2010 | Iwaki et al. | |
| 7,667,389 B2 | 2/2010 | Ikeda et al. | |
| 7,683,532 B2 | 3/2010 | Abe et al. | |
| 7,714,501 B2 | 5/2010 | Nomura et al. | |
| 2001/0046611 A1 | 11/2001 | Kido et al. | |
| 2002/0045289 A1 | 4/2002 | Dimitrakopoulos et al. | |
| 2002/0093283 A1 | 7/2002 | Seo et al. | |
| 2002/0101154 A1 | 8/2002 | Seo et al. | |
| 2002/0121860 A1 | 9/2002 | Seo et al. | |
| 2002/0139303 A1 | 10/2002 | Yamazaki et al. | |
| 2003/0015698 A1 | 1/2003 | Baldo et al. | |
| 2003/0085398 A1 | 5/2003 | Koyama et al. | |
| 2003/0092214 A1 | 5/2003 | Klauk et al. | |
| 2003/0092232 A1 * | 5/2003 | Klauk et al. | 438/200 |
| 2003/0213952 A1 | 11/2003 | Iechi et al. | |
| 2003/0218166 A1 | 11/2003 | Tsutsui | |
| 2004/0012017 A1 * | 1/2004 | Nagayama | 257/40 |
| 2004/0075093 A1 * | 4/2004 | Arai et al. | 257/66 |
| 2004/0108562 A1 | 6/2004 | Nagayama et al. | |
| 2004/0161192 A1 | 8/2004 | Gyoutoku et al. | |
| 2004/0206959 A1 | 10/2004 | Heeger et al. | |
| 2005/0042548 A1 | 2/2005 | Klauk et al. | |
| 2005/0057136 A1 | 3/2005 | Moriya et al. | |
| 2005/0084712 A1 | 4/2005 | Kido et al. | |
| 2005/0098207 A1 | 5/2005 | Matsumoto et al. | |
| 2005/0170208 A1 | 8/2005 | Yatsunami et al. | |
| 2005/0248267 A1 | 11/2005 | Gyoutoku et al. | |
| 2006/0008740 A1 | 1/2006 | Kido et al. | |
| 2006/0020136 A1 | 1/2006 | Hwang et al. | |
| 2006/0033098 A1 * | 2/2006 | Shih et al. | 257/40 |
| 2006/0043346 A1 * | 3/2006 | Kodas et al. | 252/514 |
| 2006/0046096 A1 | 3/2006 | Nomura et al. | |
| 2006/0118166 A1 | 6/2006 | Iwaki | |
| 2006/0180812 A1 | 8/2006 | Ikeda et al. | |
| 2006/0228822 A1 | 10/2006 | Hayakawa et al. | |
| 2006/0232203 A1 | 10/2006 | Noda | |
| 2006/0237731 A1 * | 10/2006 | Furukawa et al. | 257/83 |
| 2006/0238112 A1 | 10/2006 | Kasama et al. | |
| 2006/0270066 A1 * | 11/2006 | Imahayashi et al. | 438/4 |
| 2006/0273303 A1 | 12/2006 | Wu et al. | |
| 2007/0007516 A1 | 1/2007 | Seo et al. | |
| 2007/0031701 A1 | 2/2007 | Nakashima et al. | |
| 2008/0048183 A1 * | 2/2008 | Ohsawa et al. | 257/40 |
| 2008/0099757 A1 | 5/2008 | Furukawa et al. | |
| 2009/0267077 A1 | 10/2009 | Furukawa et al. | |

FOREIGN PATENT DOCUMENTS

| | | |
|---|---|---|
| EP | 1 524 706 | 4/2005 |
| EP | 1 530 245 | 5/2005 |
| GB | 2379085 | 2/2003 |
| JP | 03-274695 A | 12/1991 |
| JP | 07-022670 | 1/1995 |
| JP | 09-063771 A | 3/1997 |
| JP | 11-307259 | 11/1999 |
| JP | 11-307264 A | 11/1999 |
| JP | 2002-204012 A | 7/2002 |
| JP | 2003-298056 | 10/2003 |
| JP | 2004-103905 A | 4/2004 |
| JP | 2004-228371 | 8/2004 |
| JP | 2004-527122 A | 9/2004 |
| JP | 2005-026121 A | 1/2005 |
| JP | 2006-332614 A | 12/2006 |
| JP | 2007-036188 A | 2/2007 |
| WO | WO-02/082560 A | 10/2002 |
| WO | WO 2004/102615 | 11/2004 |
| WO | WO-2005/031798 A | 4/2005 |
| WO | WO 2006/062217 | 6/2006 |
| WO | WO-2007/015407 A | 2/2007 |
| WO | WO 2007/086534 | 8/2007 |

OTHER PUBLICATIONS

Wu et al. in "Indolo[3,2-b]carbazole-Based Thin-Film Transistors with High Mobility and Stability", J. Am. Chem. Soc. 2005, 127, p. 614-618. Published online on Dec. 9, 2004.*

International Search Report (Application No. PCT/JP2006/308679) dated Sep. 5, 2006.

Written Opinion (Application No. PCT/JP2006/308679) dated Sep. 5, 2006.

Lin et al., Stacked Pentacene Layer Organic Thin-Film Transistors with Improved Characteristics, IEEE Electron Device Letters, vol. 18, No. 12, Dec. 1997, pp. 606-608.

Lin.J et al., "Light-Emitting Carbazole Derivatives for Electroluminescent Materials," Organic Light-Emitting Materials and Devices V (Proceedings of SPIE—The International Society for Optical Engineering), 2002, vol. 4464, pp. 307-316.

Lin.J et al., "Light-Emitting Carbazole Derivatives for Electroluminescent Materials," Organic Light-Emitting Materials and Devices IV (Proceedings of SPIE—The International Society for Optical Engineering), 2002, vol. 4464, pp. 307-316.

* cited by examiner

ORGANIC SEMICONDUCTOR DEVICE HAVING COMPOSITE ELECTRODE

TECHNICAL FIELD

The present invention relates to a transistor which can be used as a switching element or an amplifying element.

BACKGROUND ART

Electric conductivity of a semiconductor layer provided between two electrodes, namely, a source electrode and a drain electrode in a field effect transistor is controlled by voltage which is applied to a gate electrode. Basically, a field effect transistor is a representative example of a unipolar element, in which electric charge is transported by either a p-type or an n-type carrier (hole or electron).

These transistors can form various switching elements or amplifying elements depending on the combination; therefore, the transistors are applied in various fields. For example, a switching element of a pixel in an active matrix display is given as an application example thereof.

As a semiconductor material used for such a transistor, an inorganic semiconductor material typified by silicon has been widely used so far. However, high-temperature processing is required in order to deposit an inorganic semiconductor material as a semiconductor layer; therefore, it is difficult to use a plastic substrate or a film as a substrate.

On the other hand, when an organic semiconductor material is used as a semiconductor layer, deposition can be performed at relatively low temperature. Accordingly, it becomes possible to manufacture a transistor over not only a glass substrate but also a substrate with a low heat-resistant property such as plastic, theoretically.

As described above, as an example of a transistor using an organic semiconductor material as a semiconductor layer (hereinafter, referred to as an organic transistor), a transistor using silicon dioxide ($SiO_2$) as a gate insulating layer and pentacene as a semiconductor layer is given (Non Patent Document 1; Y. Y. Lin, D. J. Gundlach, S. F. Nelson, T. N. Jackson, IEEE Electron Device Letters, Vol. 18, 606-608 (1997)). According to this document, electric field effect mobility is 1 $cm^2/Vs$, and transistor performance which is equal to amorphous silicon can be obtained even when an organic semiconductor material is used as a semiconductor layer.

In an organic transistor, carriers are transported between a source electrode/ a drain electrode and a semiconductor layer. When there is a large energy barrier at the interface therebetween, transistor characteristics such as electric field effect mobility deteriorate. In order to solve this problem, it has been proposed to use a lithium fluoride layer for an interface between a source electrode/a drain electrode and a semiconductor layer (Patent Document 1; Japanese Patent Laid-Open No. 2003-298056). However, a lithium fluoride layer can be applied only to an n-channel organic transistor; therefore, an organic semiconductor material is limited to n-type. It has also been proposed to dope a semiconductor layer with a conductivity imparting agent (Patent Document 2; Japanese Patent Laid-Open No. 2004-228371); however, there is a problem that a conductivity imparting agent has low chemical stability. Moreover, adhesion between these electrode materials and organic semiconductor materials is important in order to obtain a transistor having excellent durability.

Also, carrier mobility of an n-type organic transistor is generally said to be smaller compared with carrier mobility of a p-type organic transistor. Note that a carrier of a p-type organic transistor is a hole and a carrier of an n-type organic transistor is an electron. When various switching elements or amplifying element are formed by combining organic transistors having a difference in the carrier mobility, a problem is possibly caused to characteristics thereof.

As described above, a source electrode and a drain electrode that can be used for an organic transistor using various organic semiconductor materials, that are chemically stable, and that have excellent adhesion with an organic semiconductor material are required. It is because an organic transistor having favorable transistor characteristics and excellent durability can be obtained by using such a source electrode and a drain electrode.

In addition, a source electrode and a drain electrode function also as a wiring in an organic transistor in many cases; therefore, high conductivity is required. However, few source electrode and drain electrode with the characteristics as described above and high conductivity have been reported.

DISCLOSURE OF THE INVENTION

It is an object of the present invention to provide an electrode for an organic transistor which can reduce an energy barrier at an interface with a semiconductor layer in a field effect transistor including a semiconductor layer using an organic semiconductor material (in the present invention, referred to as an organic transistor). It is another object to provide an electrode for an organic transistor which can be used for various organic semiconductor materials. Also, it is another object to provide an electrode for an organic transistor which is chemically stable. In addition, it is another object to provide an electrode for an organic transistor having excellent adhesion with a semiconductor layer.

Also, it is another object of the present invention to provide an electrode for an organic transistor being excellent in conductivity and being able to be used also as a wiring in addition to having the characteristics as described above.

Moreover, it is another object of the present invention to provide an electrode for an organic transistor having a small threshold shift.

In addition, in an organic transistor, it is necessary to consider a work function when selecting an electrode in order to inject carriers efficiently. The restriction by the work function is severe, and only a small number of conductive materials which meet requirements can be used in the present situation. For example, gold is given as a conductive material which is often used as an electrode of a p-type organic transistor, and it is necessary to fulfill a work function by using the expensive noble metal as described above or high melting point metal such as tungsten or tantalum which needs a deposition method by which damage is given to a deposition surface such as a sputtering method.

It is an object of the present invention, in a case of using a conductive material as a part of an electrode for an organic transistor, to provide an electrode for an organic transistor, an organic transistor, and a semiconductor device each of which has a structure which is not controlled by the work function when selecting the conductive material.

Moreover, it is another object of the present invention to provide an organic transistor or a semiconductor device having favorable electric field effect mobility. Also, it is another object to provide an organic transistor or a semiconductor device having excellent durability.

As a result of keen examinations, the present inventors found that, when a composite layer containing an organic compound and an inorganic compound is used as an electrode for an organic transistor, that is, a part of at least one of an source electrode and a drain electrode in the organic transistor, an energy barrier at an interface between the electrode and a semiconductor layer is reduced and transistor characteristics are improved. The present inventors also found that carrier mobility is improved.

Also, the present inventors found that an electrode having such a structure is chemically stable and excellent in adhesion with a semiconductor layer in a case of being used as a source electrode or a drain electrode of an organic transistor. Moreover, it was found that the electrode can lower drive voltage and reduce a threshold shift of the transistor. Note that a carrier is a hole in a case of a p-type organic transistor, and a carrier is an electron in a case of an n-type organic transistor.

Therefore, according to one feature of the present invention, a structure of an electrode for an organic transistor which is used as a source electrode/a drain electrode includes a composite layer containing an organic compound and an inorganic compound as a part thereof.

At this time, as the organic compound, a carbazole derivative or aromatic hydrocarbon and a derivative thereof represented by following general formulas (1) to (4) are preferable. As a specific example of a carbazole derivative represented by any of the general formulas (1) to (4), N-(2-naphthyl)carbazole (abbreviation: NCz); 4,4'-di(N-carbazolyl)biphenyl (abbreviation: CBP); 9,10-bis[4-(N-carbazolyl)phenyl]anthracene (abbreviation: BCPA); 3,5-bis[4-(N-carbazolyl)phenyl]biphenyl (abbreviation: BCPBi); 1,3,5-tris[4-(N-carbazolyl)phenyl]benzene (abbreviation: TCPB); or the like can be given. In addition, as a specific example of aromatic hydrocarbon, anthracene; 9,10-diphenylanthracene (abbreviation: DPA); 2-tert-butyl-9,10-di(2-naphthyl)anthracene (abbreviation; t-BuDNA); tetracene; rubrene; pentacene; or the like can be given.

In addition, oxide or nitride of transition metal can be used as the inorganic compound, and it is desirable to use oxide or nitride of metal belonging to Group 4 to Group 8 of the periodic table. In particular, vanadium oxide, tantalum oxide, molybdenum oxide, tungsten oxide, rhenium oxide, and ruthenium oxide are preferably used.

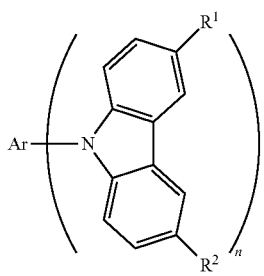

(1)

In the formula, Ar represents an aromatic hydrocarbon group having 6 to 42 carbon atoms, n represents a natural number of 1 to 3, and each of $R^1$ and $R^2$ represents any of hydrogen, an alkyl group having 1 to 4 carbon atoms and an aryl group having 6 to 12 carbon atoms.

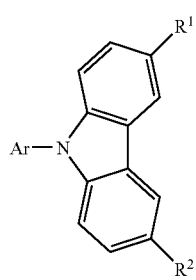

(2)

In the formula, Ar represents a monovalent aromatic hydrocarbon group having 6 to 42 carbon atoms, and each of $R^1$ and $R^2$ represents any of hydrogen, an alkyl group having 1 to 4 carbon atoms and an aryl group having 6 to 12 carbon atoms.

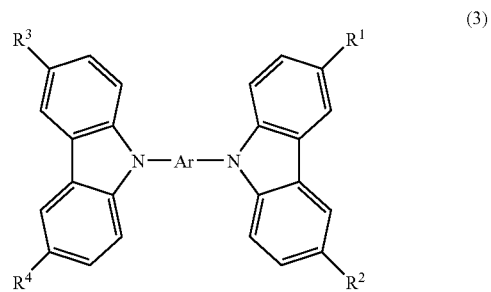

(3)

In the formula, Ar represents a divalent aromatic hydrocarbon group having 6 to 42 carbon atoms, and each of $R^1$ to $R^4$ represents any of hydrogen, an alkyl group having 1 to 4 carbon atoms and an aryl group having 6 to 12 carbon atoms.

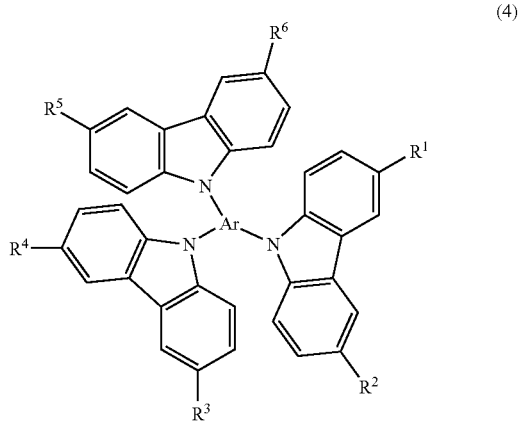

(4)

In the formula, Ar represents a trivalent aromatic hydrocarbon group having 6 to 42 carbon atoms, and each of $R^1$ to $R^6$ represents any of hydrogen, an alkyl group having 1 to 4 carbon atoms and an aryl group having 6 to 12 carbon atoms.

Note that it is preferable that the above described source electrode and drain electrode for an organic transistor of the present invention further have a conductive material. Accordingly, a source electrode and a drain electrode that are excellent in conductivity and can be used also as a wiring can be obtained.

Also, according to another feature of the present invention, a structure of an electrode for an organic transistor includes a first composite layer containing a first inorganic compound and a first organic compound having an electron transporting property and a second composite layer containing a second organic compound and a second inorganic compound as a part thereof.

At this time, the first inorganic compound contained in the first composite layer is preferably alkali metal and alkaline earth metal, or oxide or nitride containing these metals.

Also, as the second organic compound contained in the second composite layer, a carbazole derivative or aromatic hydrocarbon and a derivative thereof represented by following general formulas (1) to (4) are preferable. As a specific example of a carbazole derivative represented by any of the general formulas (1) to (4), N-(2-naphthyl)carbazole (abbreviation: NCz); 4,4'-di(N-carbazolyl)biphenyl (abbreviation: CBP); 9,10-bis[4-(N-carbazolyl)phenyl]anthracene (abbreviation: BCPA); 3,5-bis[4-(N-carbazolyl)phenyl]biphenyl (abbreviation: BCPBi); 1,3,5-tris[4-(N-carbazolyl)phenyl]

benzene (abbreviation: TCPB); or the like can be given. In addition, as a specific example of aromatic hydrocarbon, anthracene; 9,10-diphenylanthracene (abbreviation: DPA); 2-tert-butyl-9,10-di(2-naphthyl)anthracene (abbreviation; t-BuDNA); tetracene; ruburene; pentacene; or the like can be given.

In addition, oxide or nitride of transition metal can be used as the second inorganic compound, and it is desirable to use oxide or nitride of metal belonging to Group 4 to Group 8 of the periodic table. In particular, vanadium oxide, tantalum oxide, molybdenum oxide, tungsten oxide, rhenium oxide, and ruthenium oxide are preferably used.

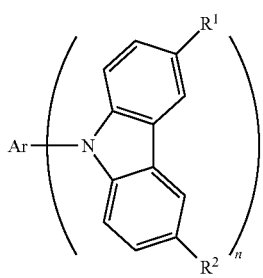

(1)

In the formula, Ar represents an aromatic hydrocarbon group having 6 to 42 carbon atoms, n represents a natural number of 1 to 3, and each of $R^1$ and $R^2$ represents any of hydrogen, an alkyl group having 1 to 4 carbon atoms and an aryl group having 6 to 12 carbon atoms.

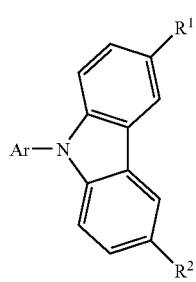

(2)

In the formula, Ar represents a monovalent aromatic hydrocarbon group having 6 to 42 carbon atoms, and each of $R^1$ and $R^2$ represents any of hydrogen, an alkyl group having 1 to 4 carbon atoms and an aryl group having 6 to 12 carbon atoms.

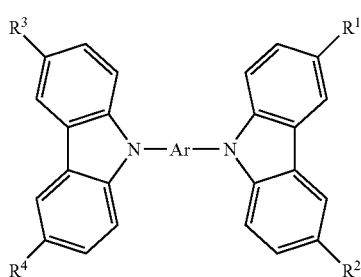

(3)

In the formula, Ar represents a divalent aromatic hydrocarbon group having 6 to 42 carbon atoms, and each of $R^1$ to $R^4$ represents any of hydrogen, an alkyl group having 1 to 4 carbon atoms and an aryl group having 6 to 12 carbon atoms.

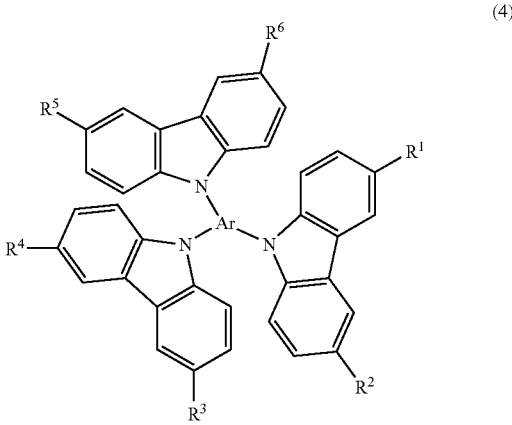

(4)

In the formula, Ar represents a trivalent aromatic hydrocarbon group having 6 to 42 carbon atoms, and each of $R^1$ to $R^6$ represents any of hydrogen, an alkyl group having 1 to 4 carbon atoms and an aryl group having 6 to 12 carbon atoms.

Also, as for the electrode for the organic transistor of the present invention, it is preferable that the first composite layer and the second composite layer are in contact with each other, and the second composite layer and the conductive layer are in contact with each other.

Note that it is preferable that the above described source electrode and drain electrode for the organic transistor of the present invention further have a conductive material. Accordingly, a source electrode and a drain electrode that are excellent in conductivity and can be used also as a wiring can be obtained.

An organic transistor using the source electrode and the drain electrode as described above is also one mode of the present invention. In other words, according to one feature of the present invention, a structure of an organic transistor includes a semiconductor layer containing an organic semiconductor material and a source electrode and a drain electrode, where at least one of the source electrode and the drain electrode includes a composite layer containing an organic compound and an inorganic compound.

At this time, as the organic compound, a carbazole derivative or aromatic hydrocarbon and a derivative thereof represented by following general formulas (1) to (4) are preferable. As a specific example of a carbazole derivative represented by any of the general formulas (1) to (4), N-(2-naphthyl)carbazole (abbreviation: NCz); 4,4'-di(N-carbazolyl)biphenyl (abbreviation: CBP); 9,10-bis[4-(N-carbazolyl)phenyl]anthracene (abbreviation: BCPA); 3,5-bis[4-(N-carbazolyl)phenyl]biphenyl (abbreviation: BCPBi); 1,3,5-tris[4-(N-carbazolyl)phenyl]benzene (abbreviation: TCPB); or the like can be given. In addition, as a specific example of aromatic hydrocarbon, anthracene; 9,10-diphenylanthracene (abbreviation: DPA); 2-tert-butyl-9,10-di(2-naphthyl)anthracene (abbreviation; t-BuDNA); tetracene; ruburene; pentacene; or the like can be given.

In addition, oxide or nitride of transition metal can be used as the second inorganic compound, and it is desirable to use oxide or nitride of metal belonging to Group 4 to Group 8 of the periodic table. In particular, vanadium oxide, tantalum oxide, molybdenum oxide, tungsten oxide, rhenium oxide, and ruthenium oxide are preferably used.

(1)

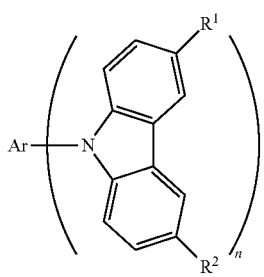

In the formula, Ar represents an aromatic hydrocarbon group having 6 to 42 carbon atoms, n represents a natural number of 1 to 3, and each of $R^1$ and $R^2$ represents any of hydrogen, an alkyl group having 1 to 4 carbon atoms and an aryl group having 6 to 12 carbon atoms.

(2)

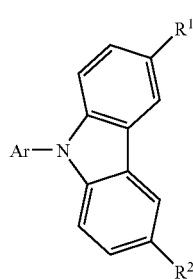

In the formula, Ar represents a monovalent aromatic hydrocarbon group having 6 to 42 carbon atoms, and each of $R^1$ and $R^2$ represents any of hydrogen, an alkyl group having 1 to 4 carbon atoms and an aryl group having 6 to 12 carbon atoms.

(3)

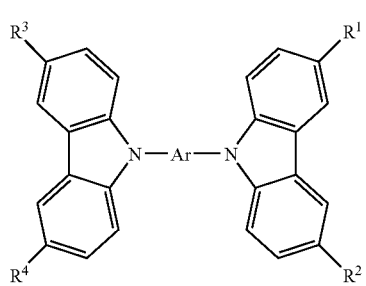

In the formula, Ar represents a divalent aromatic hydrocarbon group having 6 to 42 carbon atoms, and each of $R^1$ to $R^4$ represents any of hydrogen, an alkyl group having 1 to 4 carbon atoms and an aryl group having 6 to 12 carbon atoms.

(4)

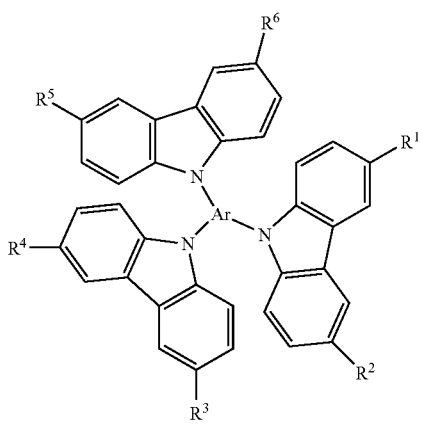

In the formula, Ar represents a trivalent aromatic hydrocarbon group having 6 to 42 carbon atoms, and each of $R^1$ to $R^6$ represents any of hydrogen, an alkyl group having 1 to 4 carbon atoms and an aryl group having 6 to 12 carbon atoms.

In addition, a composite layer is preferably in contact with the semiconductor layer.

In addition, according to another feature of a structure of the present invention, the organic semiconductor material is the same as an organic compound contained in the composite layer.

Note that, in the above described composite layer, a mixture ratio of the organic compound to the inorganic compound is preferably in a range of organic compound/inorganic compound=0.1 to 10, more preferably, 0.5 to 2 in a molar ratio.

According to another feature of the present invention, the electrode further includes the above described conductive material. In addition, another feature is that an edge portion of the conductive material is covered with a composite layer containing an organic compound and an inorganic compound.

Also, according to another feature of the present invention, a structure of an organic transistor includes a semiconductor layer containing an organic semiconductor material, and a source electrode and a drain electrode, where at least one of the source electrode and the drain electrode includes a first composite layer containing a first inorganic compound and a first organic compound having an electron transporting property, and a second composite layer containing a second organic compound and a second inorganic compound.

At this time, the first inorganic compound contained in the first composite layer is preferably alkali metal and alkaline earth metal, or oxide or nitride containing these metals.

Also, as the second organic compound contained in the second composite layer, a carbazole derivative or aromatic hydrocarbon and a derivative thereof represented by following general formulas (1) to (4) are preferable. As a specific example of a carbazole derivative represented by any of the general formulas (1) to (4), N-(2-naphthyl)carbazole (abbreviation: NCz); 4,4'-di(N-carbazolyl)biphenyl (abbreviation: CBP); 9,10-bis[4-(N-carbazolyl)phenyl]anthracene (abbreviation: BCPA); 3,5-bis[4-(N-carbazolyl)phenyl]biphenyl (abbreviation: BCPBi); 1,3,5-tris[4-(N-carbazolyl)phenyl]benzene (abbreviation: TCPB); or the like can be given. In addition, as a specific example of aromatic hydrocarbon, anthracene; 9,10-diphenylanthracene (abbreviation: DPA); 2-tert-butyl-9,10-di(2-naphthyl)anthracene (abbreviation; t-BuDNA); tetracene; ruburene; pentacene; or the like can be given.

In addition, oxide or nitride of transition metal can be used as the second inorganic compound, and it is desirable to use oxide or nitride of metal belonging to Group 4 to Group 8 of the periodic table. In particular, vanadium oxide, tantalum oxide, molybdenum oxide, tungsten oxide, rhenium oxide, and ruthenium oxide are preferably used.

(1)

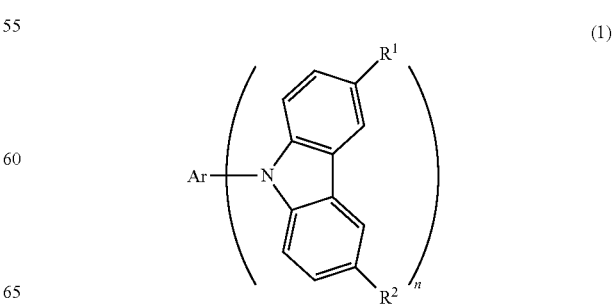

In the formula, Ar represents an aromatic hydrocarbon group having 6 to 42 carbon atoms, n represents a natural number of 1 to 3, and each of $R^1$ and $R^2$ represents any of hydrogen, an alkyl group having 1 to 4 carbon atoms and an aryl group having 6 to 12 carbon atoms.

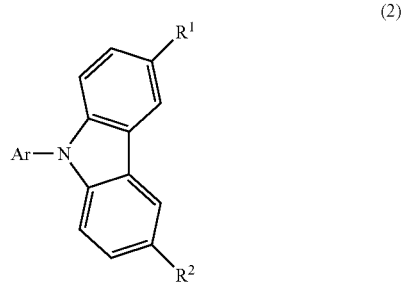

(2)

In the formula, Ar represents a monovalent aromatic hydrocarbon group having 6 to 42 carbon atoms, and each of $R^1$ and $R^2$ represents any of hydrogen, an alkyl group having 1 to 4 carbon atoms and an aryl group having 6 to 12 carbon atoms.

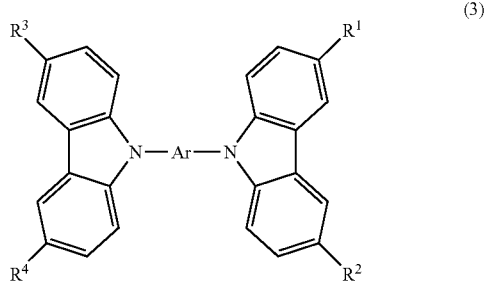

(3)

In the formula, Ar represents a divalent aromatic hydrocarbon group having 6 to 42 carbon atoms, and each of $R^1$ to $R^4$ represents any of hydrogen, an alkyl group having 1 to 4 carbon atoms and an aryl group having 6 to 12 carbon atoms. In addition, a composite layer is preferably provided being in contact with the semiconductor layer.

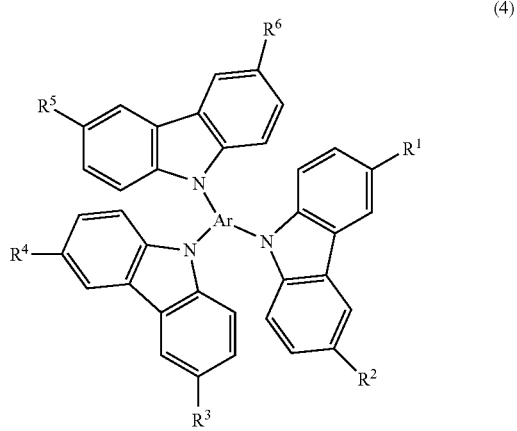

(4)

In the formula, Ar represents a trivalent aromatic hydrocarbon group having 6 to 42 carbon atoms, and each of $R^1$ to $R^6$ represents any of hydrogen, an alkyl group having 1 to 4 carbon atoms and an aryl group having 6 to 12 carbon atoms. In addition, a composite layer is preferably provided being in contact with the semiconductor layer.

Note that, in the above described second composite layer, a mixture ratio of the organic compound to the inorganic compound is preferably in a range of organic compound/inorganic compound=0.1 to 10, more preferably, 0.5 to 2 in a molar ratio.

In addition, it is preferable that the first composite layer and the second composite layer are in contact with each other.

Also, according to another feature of a structure of the present invention, the organic semiconductor material is the same as an organic compound contained in the second composite layer.

Moreover, a semiconductor device using the source electrode and the drain electrode as described above is also one mode of the present invention. In other words, according to one feature of the present invention, a structure of a semiconductor device includes a semiconductor layer containing an organic semiconductor material, and a source electrode and a drain electrode, where at least one of the source electrode and the drain electrode includes a composite layer containing an organic compound and an inorganic compound. Similarly, according to another feature of the present invention, a structure of a semiconductor device includes a semiconductor layer containing an organic semiconductor material, and a source electrode and a drain electrode, where at least one of the source electrode and the drain electrode includes a first composite layer containing an inorganic compound and a first organic compound having an electron transporting property, and a second composite layer containing a second organic compound and a second inorganic compound.

By carrying out the present invention, in a field effect transistor including a semiconductor layer using an organic semiconductor material, a source electrode and a drain electrode that can reduce an energy barrier at an interface with the semiconductor layer can be obtained. Also, a source electrode and a drain electrode that can be used for various organic semiconductor materials can be obtained. In addition, a source electrode and a drain electrode that are chemically stable can be obtained. Moreover, a source electrode and a drain electrode that are excellent in adhesion with a semiconductor layer can be obtained.

In addition, as for an electrode for an organic transistor of the present invention including a composite layer containing an organic compound and an inorganic compound as a part thereof, a conductive material can be selected without considering restriction by a work function; therefore the electrode for an organic transistor of the present invention has a structure which has an expanded range of choice and is advantageous in cost. Also, resistance can be reduced by using a conductive material at the same time; therefore, the electrode can be used also as a wiring.

Moreover, by carrying out the present invention, an organic transistor having favorable electric field effect mobility can be provided. In addition, an organic transistor having excellent durability can be provided.

BEST MODE FOR CARRYING OUT THE INVENTION

Figure 1A:
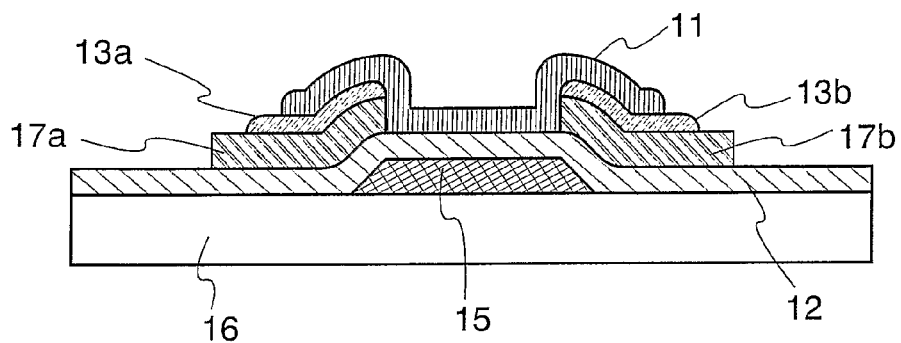
FIGS. 1A to 1D are schematic views each showing a constructional example of an organic transistor of the present invention.

As for an organic transistor o, it is required that carrier density of an organic semiconductor layer is controlled efficiently by electric field effect in order to obtain excellent transistor characteristics. Also, when carriers are efficiently supplied from a source electrode to an organic semiconductor layer, the transistor characteristics are improved. Moreover, when carriers are efficiently discharged from the organic semiconductor layer to a drain electrode, the transistor characteristics are improved. Therefore, as for an organic transistor, it is required that carriers are efficiently supplied from a source electrode to an organic semiconductor layer or carriers are efficiently discharged from the organic semiconductor layer to a drain electrode in order to obtain excellent transistor characteristics. That is, it is desirable that there is no energy barrier between a source electrode and an organic semiconductor layer, and between a drain electrode and the organic semiconductor layer. It is further desirable that there is no energy barrier between a source electrode and a drain electrode and an organic semiconductor layer. However, there is generally an energy difference between a Fermi level of an electrode metal and a HOMO level of an organic semiconductor material, and there is an energy barrier between the source electrode and the organic semiconductor layer, and between the drain electrode and the organic semiconductor layer. This is one of the factors in restriction of the characteristics of the organic transistor, and is one of the reasons why a work function is required to be considered when selecting an electrode. Note that a hole is a carrier in a case of a p-type organic transistor, and an electron is a carrier in a case of an n-type organic transistor.

The present inventors found that an energy barrier between a source electrode and an organic semiconductor layer is reduced by using a composite layer containing an organic compound and an inorganic compound as a part of the source electrode. It was also found that field effect transistor characteristics are improved by efficiently supplying carriers from a source electrode to an organic semiconductor layer. In addition, it was also found that an energy barrier between a drain electrode and an organic semiconductor layer is reduced by using a composite layer containing an organic compound and an inorganic compound as a part of a drain electrode. Moreover, it was also found that field effect transistor characteristics are improved by efficiently discharging carriers from an organic semiconductor layer to a drain electrode.

It is considered that the phenomenon as described above occurs because carrier density is improved in a composite layer in which an organic compound and an inorganic compound are mixed.

Hereinafter, embodiment modes of the present invention will be described in detail with reference to the accompanying drawings. However, the present invention is not limited to the descriptions below, and it is easily understood by those skilled in the art that modes and details thereof can be modified in various ways without departing from the purpose and the scope of the present invention. Therefore, the present invention is not understood as being limited to the description of embodiment modes described below. Note that, in structures of the present invention described below, the reference numerals indicating the same portions are used in common in the drawings.

Embodiment Mode 1

Structural examples of organic transistors of the present invention are shown in FIGS. 1A to 1D. Note that, in the drawings, reference numeral 11 denotes a semiconductor layer containing an organic semiconductor material; 12, an insulating layer; 15, a gate electrode; and 16, a substrate. The source electrode and the drain electrode include a composite layer 13a and 13b and a conductive layer 17a and 17b formed of a conductive material. An arrangement of each layer or electrode can be appropriately selected in accordance with application of an element.

A glass substrate; a quartz substrate; an insulating substrate such as a crystalline glass; a ceramic substrate; a stainless steel substrate; a metal substrate (such as tantalum, tungsten, or molybdenum); a semiconductor substrate; a plastic substrate (such as polyimide, acrylic, polyethylene terephthalate, polycarbonate, polyalylate, or polyether sulfone); or the like can be used for the substrate 16. Also, these substrates may be used after being polished by a CMP method or the like, if necessary.

The insulating layer 12 can be formed by using an inorganic insulating material such as silicon oxide, silicon nitride, silicon oxide containing nitrogen, or silicon nitride containing oxygen; or an organic insulating material such as acrylic or polyimide. Besides, the insulating layer 12 can be formed by using a so-called siloxane base material in which a skeleton structure is formed by a bond of silicon and oxygen, in which, as a substituent, an organic group containing at least hydrogen (such as an alkyl group or an aryl group), a fluoro group, or an organic group and a fluoro group containing at least hydrogen is included. In addition, the insulating layer 12 may be a single layer or a multilayer.

Note that the insulating film can be deposited by a known method such as a dipping method; a coating method such as a spin coating method or a droplet discharging method; a CVD method; or a sputtering method. An organic material or a siloxane based material can be deposited by a coating method, and concavity and convexity of the bottom layer can be reduced.

Any of a low molecular compound, a middle molecular compound, and a high molecular compound can be used for an organic semiconductor material used in the present invention as long as it is an organic material which has a carrier transporting property and in which carrier density is changed by electric field effect. The types of the material are not particularly limited, and a polycyclic aromatic compound, a conjugated double bond compound, a macroring compound, a metallophthalocyanine complex, a charge transfer complex, condensed ring tetracarboxylic diimide, oligothiophene, fullerene, carbon nanotube, and the like can be given. For example, polypyrrole, polythiophene, poly(3alkylthiophene), polythienylenevinylene, poly(p-phenylenevinylene), polyaniline, polyazulene, polypyrene, polycarbazole, polyselenophene, polyfuran, poly(p-phenylene), polyindole, polypyridazine, naphthacene, tetracene, pentacene, hexacene, heptacene, pyrene, chrysene, perylene, coronene, terrylene, ovalene, quaterrylene, triphenodioxazine, triphenodiriazine, hexacene-6,15-quinone, polyvinylcarbazole, polyphenylenesulfide, polyvinylenesulfide, polyvinylpyridine, naphthalenetetracarboxylic diimide, anthracenetetracarboxylic diimide, C60, C70, C76, C78, C84, and a derivative thereof can be used. In addition, as a specific example thereof, there are pentacene, tetracene, sexythiophene (6T), copper phthalocyanine, bis-(1,2,5-thiadiazolo)-p-quinobis(1,3-dithiol), rubrene, poly (2,5-thienylenevinylene) (abbreviation: PTV), poly(3-hexylthiophene-2,5-diyl) (abbreviation: P3H), or poly(9,9'-dioctyl-fluorene-co-bithiophene) (abbreviation: F8T2), which is generally referred to as a P-type semiconductor; 7,7,8,8-tetracyanoquinodimethane (abbreviation: TCNQ), 3,4,9,10-perylenetetracarboxylicdianhydride (abbreviation: PTCDA), 1,4,5,8-naphthalenetetracarboxylicdianhydride (abbreviation: NTCDA), N,N'-dioctyl-3,4,9,10-perylenetetracarboxylicdiimide (abbreviation: PTCDI-C8H), copper16phthalocyaninefluoride (abbreviation: $F_{16}CuPc$), or 3',4'-dibutyl-5,5"-bis(dicyanomethylene)-5,5"-dihydro-2,2': 5',2"-terthiophen) (abbreviation DCMT), which is generally referred to as an N-type semiconductor; and the like. Note that characteristics of P-type or N-type in an organic semiconductor are not peculiar to the substance but depend on a relation with an electrode which injects carriers or intensity of an electric field when carriers are injected. Therefore, the semiconductor material can be P-type, N-type, or bipolar type, while it has a tendency to easily become either P-type or N-type.

These organic semiconductor materials can be formed by a known method such as an evaporation method, a spin coating method, or a droplet discharging method.

The conductive layer 17a and 17b formed of a conductive material, which is used for the gate electrode 15 and the source electrode and the drain electrode used in the present invention, is not particularly limited. Preferably, metals such as platinum, gold, aluminum, chromium, nickel, cobalt, copper, titanium, magnesium, calcium, barium or sodium, and an alloy containing these metals can be given. Besides, a conductive high molecular compound such as polyaniline, polypyrrole, polythiophene, polyacetylene or polydiacetylene; an inorganic semiconductor such as silicon, doped silicon, germanium or gallium arsenic; and the conductive high molecular compound and the inorganic semiconductor doped with acid (including Lewis acid), a halogen atom, or a metal atom of alkali metal or alkaline earth metal can also be given. Metal is generally used as a conductive material used for a source electrode and a drain electrode.

These electrode materials may be formed by a known method such as etching after being deposited by a sputtering method, an evaporation method, or the like.

Composite layers 13a and 13b comprise an organic compound and an inorganic compound, and the organic compound which is used for composite layers 13a and 13b of the present invention is not particularly limited; however, a material having a hole transporting property is preferable. A carbazole derivative or aromatic hydrocarbon and a derivative thereof represented by following general formulas (1) to (4) are further preferable. As a specific example of a carbazole derivative represented by any of the general formulas (1) to (4), N-(2-naphthyl)carbazole (abbreviation: NCz); 4,4'-di(N-carbazolyl)biphenyl (abbreviation: CBP); 9,10-bis[4-(N-carbazolyl)phenyl]anthracene (abbreviation: BCPA); 3,5-bis[4-(N-carbazolyl)phenyl]biphenyl (abbreviation: BCPBi); 1,3,5-tris[4-(N-carbazolyl)phenyl]benzene (abbreviation: TCPB); or the like can be given. In addition, as a specific example of aromatic hydrocarbon, anthracene; 9,10-diphenylanthracene (abbreviation: DPA); 2-tert-butyl-9,10-di(2-naphthyl)anthracene (abbreviation: t-BuDNA); tetracene; rubrene; pentacene; or the like can be given.

Note that oxide or nitride of transition metal can be used as the inorganic compound, and it is desirable to use a oxide or nitride of metal belonging to Group 4 to Group 8 of the periodic table. In particular, vanadium oxide, tantalum oxide, molybdenum oxide, tungsten oxide, rhenium oxide, and ruthenium oxide are preferably used.

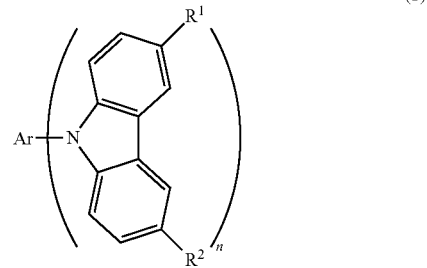

(1)

In the formula, Ar represents an aromatic hydrocarbon group having 6 to 42 carbon atoms, n represents a natural number of 1 to 3, and each of $R^1$ and $R^2$ represents any of hydrogen, an alkyl group having 1 to 4 carbon atoms and an aryl group having 6 to 12 carbon atoms.

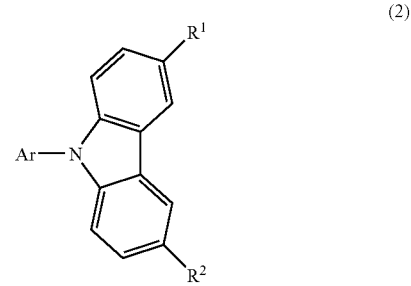

(2)

In the formula, Ar represents a monovalent aromatic hydrocarbon group having 6 to 42 carbon atoms, and each of $R^1$ and $R^2$ represents any of hydrogen, an alkyl group having 1 to 4 carbon atoms and an aryl group having 6 to 12 carbon atoms.

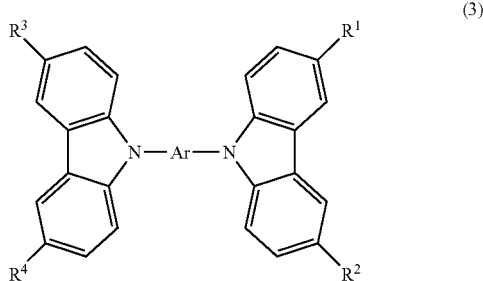

(3)

In the formula, Ar represents a divalent aromatic hydrocarbon group having 6 to 42 carbon atoms, and each of $R^1$ to $R^4$ represents any of hydrogen, an alkyl group having 1 to 4 carbon atoms and an aryl group having 6 to 12 carbon atoms.

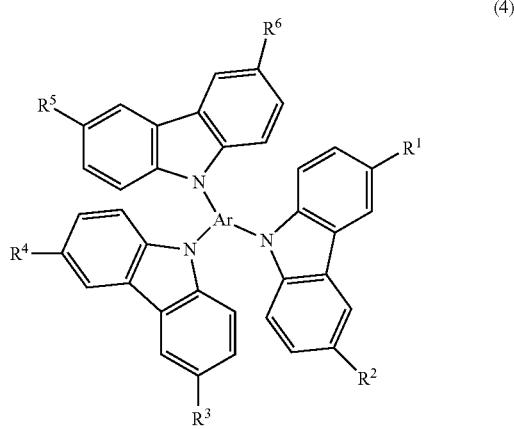

(4)

In the formula, Ar represents a trivalent aromatic hydrocarbon group having 6 to 42 carbon atoms, and each of $R^1$ to $R^6$ represents any of hydrogen, an alkyl group having 1 to 4 carbon atoms and an aryl group having 6 to 12 carbon atoms.

Note that the composite layers 13a and 13b may be formed using these materials by deposition by co-evaporation using resistance heating, deposition by co-evaporation using resistance heating evaporation and electron beam evaporation (EB evaporation), electron gun evaporation, concurrent deposition by sputtering and resistance heating, or the like. Also, the composite layers 13a and 13b may be formed by a wet method such as a sol-gel method.

Also, electric conductivity of the composite layers 13a and 13b is approximately $10^{-5}$ [S/cm], and a resistance value of a transistor is not changed even when the thickness of the composite layers is changed from several nm to several hundreds nm; therefore, the thickness can be appropriately adjusted from several nm to several hundreds nm in accordance with an application or a shape of an element which is manufactured.

Figure 1B:
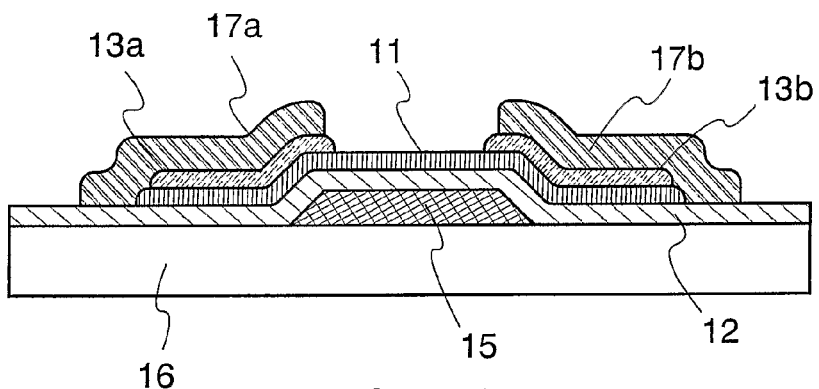
Figure 1C:
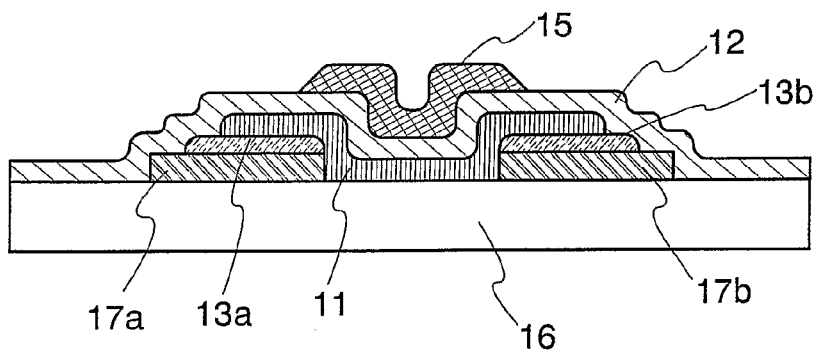

Structures in FIGS. 1A to 1D are used as examples in order to describe the present invention in more detail. FIGS. 1A and 1C each has a structure which is called a bottom contact type in which the source electrode and the drain electrode are provided below the semiconductor layer 11. In FIGS. 1A and 1B, the source electrode and the drain electrode are formed over the substrate 16 over which the gate electrode 15 and the insulating layer 12 are formed. In the structure of FIG. 1A, conductive layers 17a and 17b are formed and the composite layers 13a and 13b are stacked thereover so as to be overlapped with the conductive layers 17a and 17b; accordingly, the source electrode and the drain electrode are formed. Finally, the semiconductor layer 11 is formed so as to be between the source electrode and the drain electrode; accordingly, an organic transistor is manufactured. In this case, the composite layers 13a and 13b are provided being in contact with the semiconductor layer 11. The surfaces of the conductive layers 17a and 17b are oxidized or surface level is stabilized after the conductive layers 17a and 17b are formed; therefore, an energy barrier between the source electrode and the drain electrode and the semiconductor layer is easily generated and transistor characteristics easily deteriorate when the conductive layers 17a and 17b are directly formed on the source electrode and the drain electrode. However, by applying the source electrode and the drain electrode of this structure including the composite layers 13a and 13b, effect to reduce an energy barrier between the semiconductor layer 11 and the conductive layers 17a and 17b is generated.

Figure 1D:
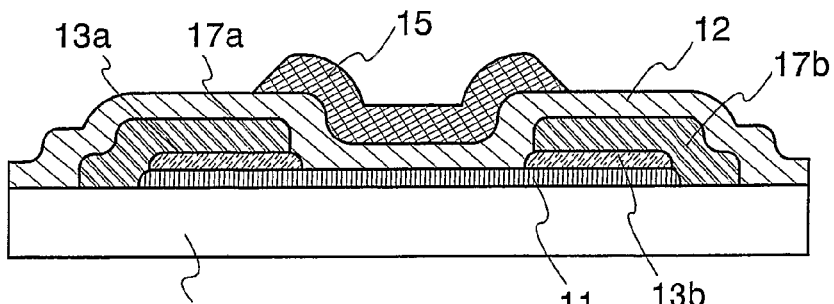
Figure 2A:
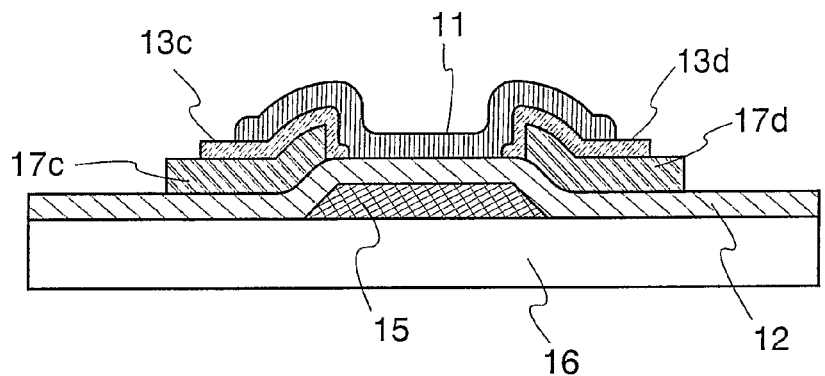
FIGS. 2A to 2D are schematic views each showing a constructional example of an organic transistor of the present invention.
Figure 2B:
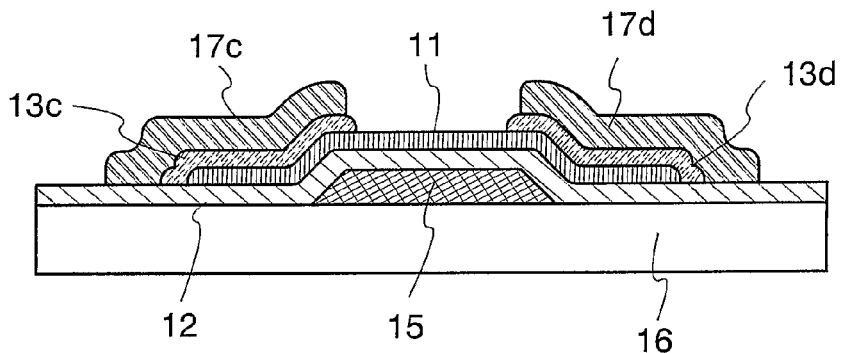
Figure 2C:
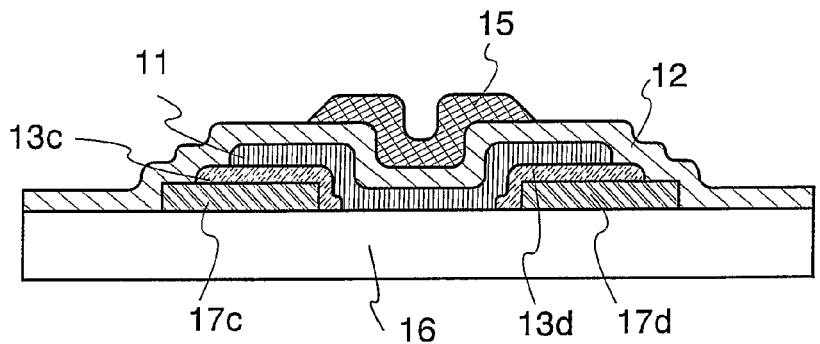
Figure 2D:
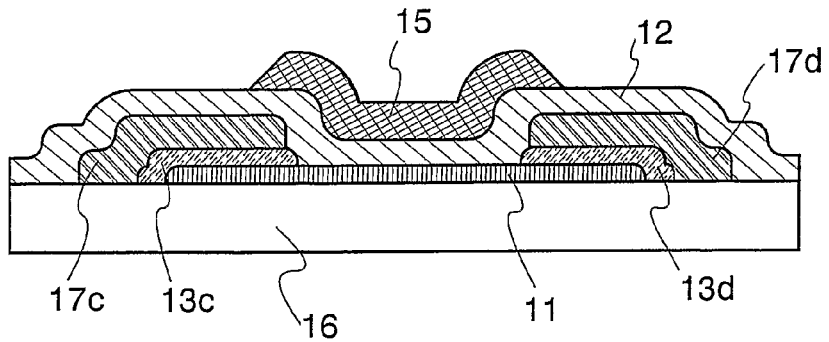
Figure 3A:
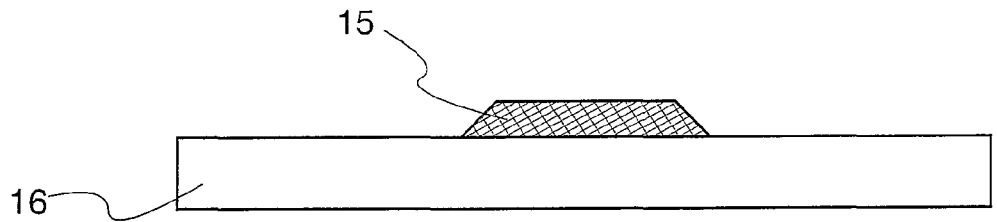
FIGS. 3A to 3E are views illustrating a manufacturing method of an organic transistor of the present invention.
Figure 3B:
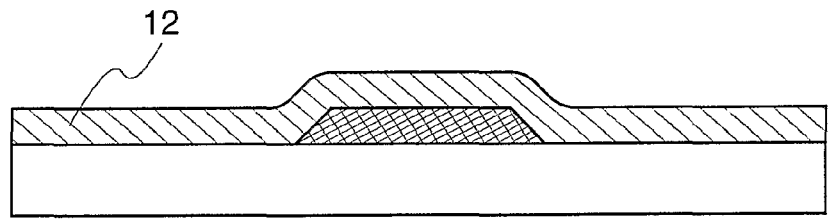
Figure 3C:
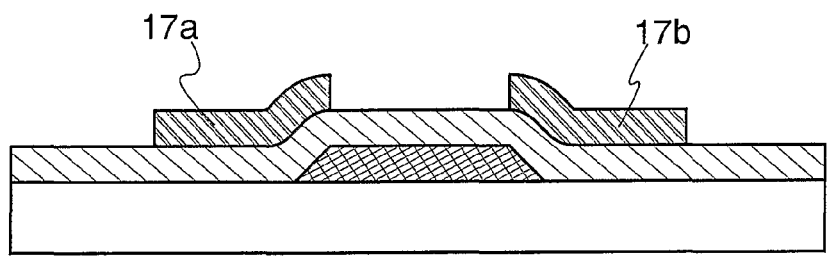
Figure 3D:
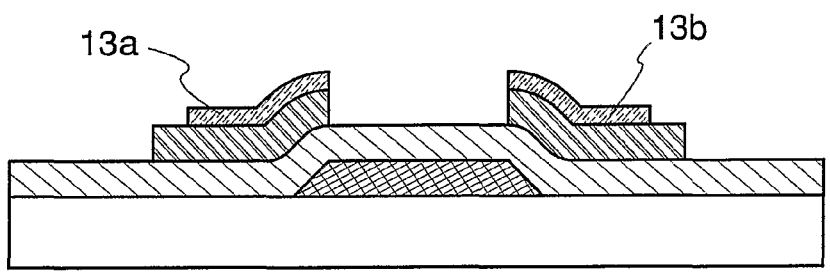
Figure 3E:
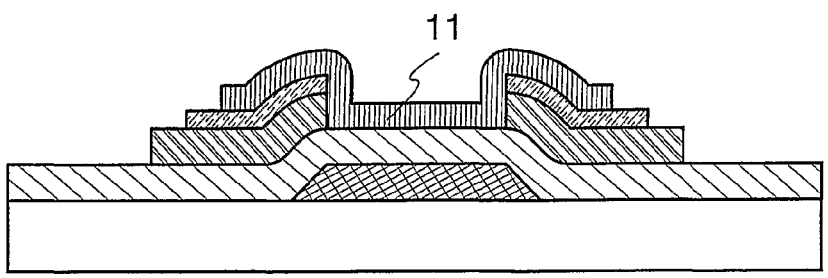

FIGS. 1B and 1D are each an example of an organic transistor having a so-called top contact structure in which the source electrode and the drain electrode are formed on the semiconductor layer 11. The composite layers 13a and 13b are formed between the semiconductor layer 11 and the conductive layers 17a and 17b, and in contact with the semiconductor layer 11; accordingly, the source electrode and the drain electrode are formed.

In a case of a top contact organic transistor, since the source electrode and the drain electrode are required to be formed on the semiconductor layer 11, there is a case where the semiconductor layer 11 is damaged and transistor characteristics deteriorate when the electrodes are formed by a sputtering method. Therefore, the electrode has been formed by an evaporation method which gives less damage; however, only a few materials such as gold can be used as an electrode material which can be formed by an evaporation method and further can meet a condition restricted by a work function. However, by forming the composite layers 13a and 13b which can be formed by an evaporation method on the semiconductor layer 11 as in the present invention, an organic transistor having favorable transistor characteristics can be easily obtained without giving damage to the semiconductor layer 11 even when it is a top contact organic transistor. Note that by forming the composite layers 13a and 13b beforehand, the semiconductor layer 11 can also be prevented from being damaged even when the conductive layers 17a and 17b are formed on the composite layers 13a and 13b by a sputtering method or the like.

As described above, by applying the source electrode and the drain electrode having a structure in which the composite layers 13a and 13b are interposed between the semiconductor layer 11 and the conductive layers 17a and 17b, an energy barrier between the semiconductor layer 11 and the source electrode and the drain electrode is reduced; accordingly, carriers are injected smoothly from the source electrode to the semiconductor layer and carriers are smoothly discharged from the semiconductor layer to the drain electrode. Therefore, it becomes possible to select the conductive layers 17a and 17b without being restricted by a work function.

In addition, the composite layers 13a and 13b are chemically stable, and adhesion thereof with the semiconductor layer 11 is also favorable compared with the conductive layers 17a and 17b. Moreover, by combining the composite layers 13a and 13b with the conductive layers 17a and 17b as in the present structure, a source electrode and a drain electrode which are excellent in conductivity and can be used also as a wiring can be provided.

As described above, by applying a source electrode and a drain electrode of this structure, an organic transistor having favorable electric field effect mobility can be provided. Also, an organic transistor which has excellent durability can be provided.

Note that, by using the composite layers 13a and 13b, an energy barrier between the source electrode and the drain electrode and the semiconductor layer 11 is reduced; therefore, it is unnecessary to select a material having low energy barrier with the semiconductor layer 11 (in other words, a material having no restriction by a work function) as a material for the source electrode and the drain electrode, which is one of the advantages of the present invention.

Embodiment Mode 2

Subsequently, a structure in which an organic compound used for a composite layer is also used for a semiconductor layer will be described. Since organic compounds that are used for a composite layer and a semiconductor layer are the same in this structure, advantages such as a simple manufacturing process and lower cost are obtained. Moreover, adhesion between a semiconductor layer and a source electrode and a drain electrode, and chemical stability of the interfaces are improved; accordingly, further improvement of transistor characteristics can be expected. Also, improvement in durability of an organic transistor can be expected.

A semiconductor material which is used in the present invention is not particularly limited; however, the same organic compound as that used for the composite layer described in Embodiment Mode 1 is used.

A structure of FIG. 1A is used as an example in order to describe the present invention in more detail. As shown in FIG. 1A, a source electrode and a drain electrode are formed over a substrate 16 over which a gate electrode 15 and an insulating layer 12 are formed. Conductive layers 17a and 17b are formed and composite layers 13a and 13b are stacked thereon; accordingly, a source electrode and a drain electrode are formed. Note that an organic compound which is used for the composite layers 13a and 13b are the same as the organic semiconductor material of a semiconductor layer 11 which is subsequently formed. Finally, the semiconductor layer 11 is formed so as to be between the source electrode and the drain electrode; accordingly, an organic transistor is manufactured. In this case, the composite layers 13a and 13b are provided being in contact with the semiconductor layer 11.

As described above, by applying the source electrode and the drain electrode having a structure in which the composite layers 13a and 13b are interposed between the semiconductor layer 11 and the conductive layers 17a and 17b, an energy barrier between the semiconductor layer 11 and the source electrode and the drain electrode is reduced as already described in Embodiment Mode 1. Carriers are injected smoothly from the source electrode to an organic semiconductor layer, and carriers are smoothly discharged from the semiconductor layer to the drain electrode. Also, by making the organic compound used for the composite layers 13a and 13b the same as the organic semiconductor material used for the semiconductor layer 11, adhesion between the semiconductor layer 11 and the source electrode and the drain electrode and chemical stability of the interface are improved; therefore, a structure which reduces an energy barrier between the semiconductor layer 11 and the conductive layers 17a and 17b more effectively by the composite layers 13a and 13b can be obtained. In addition, durability of a transistor is also improved.

Further, this embodiment mode is described with reference to the structure of FIG. 1A; however, the structure of this embodiment mode can be applied to other structures of FIGS. 1B to 1D. Also, a structure and a material other than those described in this embodiment mode are the same as Embodiment Mode 1; therefore the repeated description is omitted. The description of Embodiment Mode 1 is given as a reference.

Embodiment Mode 3

In this embodiment mode, a structure in which an edge surface of a conductive layers 17a and 17b of an organic transistor are covered with a composite layer and the conductive layers 17a and 17b and the semiconductor layer 11 are not directly in contact with each other will be described with reference to FIGS. 2A to 2D. Structures of FIGS. 2A to 2D are different from Embodiment Mode 1 in that an edge surfaces of conductive layers 17a and 17b or a semiconductor layer 11 of an organic transistor are covered with composite layers. In the structures of FIGS. 2A to 2D, a portion which is not described in this embodiment mode is based on Embodiment Mode 1. Note that FIGS. 2A to 2D correspond to FIGS. 1A to 1D, respectively, and FIGS. 2B and 1B, 2D and 1D are the same.

As for an organic transistor, depending on an organic material which is used as a semiconductor layer, there is a case where an alignment direction of the organic material highly affects a flow of a current. Therefore, consideration is normally given to the alignment to be aligned so that carriers easily flow in a portion where a channel is formed.

As described above, the structure of this embodiment mode is a structure in which edge surfaces of the conductive layers 17a and 17b of the organic transistor shown in Embodiment Mode 1 is covered with the composite layer and the conductive layers 17a and 17b and the semiconductor layer 11 are not directly in contact with each other. By applying such a structure, carriers can be injected smoothly in a direction of a flow of a current, and characteristics of an organic transistor can be improved.

Note that a structure and a material other than those described in this embodiment mode are the same as Embodiment Mode 1; therefore the repeated description is omitted, and the description of Embodiment Mode 1 is given as a reference.

Embodiment Mode 4

A manufacturing method of an organic transistor of the present invention shown in FIG. 1A will be hereinafter described with reference to FIGS. 3A to 3E.

A gate electrode 15 formed from tungsten is deposited to be 100 nm on a quartz substrate 16, an insulating layer 12 formed from silicon dioxide ($SiO_2$) is deposited to be 100 nm as a gate insulating film on the gate electrode, and conductive layers 17a and 17b formed from tungsten are deposited to be 100 nm on the insulating layer 12. After tungsten is deposited on the entire surface of the substrate by a sputtering method or the like, a mask is formed by photolithography and the gate electrode 15 is formed with a desired shape by etching. Either wet etching or dry etching may be used as the etching. The insulating layer 12 is formed by a CVD method. Also, the conductive layers 17a and 17b may be formed in the same manner as the gate electrode. On the conductive layers 17a and 17b, as composite layers 13a and 13b, molybdenum oxide (VI) and NPB (4,4'-bis[N-(1-naphthyl)-N-phenylamino]biphenyl) which is an aromatic amine compound are co-evaporated to be 10 nm using masks by vacuum evaporation by resistance heating so that a molar ratio becomes 1 to 1, and a source electrode and a drain electrode formed of the conductive layers 17a and 17b and the composite layer 13a and 13b are formed. Thereafter, pentacene is evaporated between the source electrode and the drain electrode to deposit as a semiconductor layer 11; accordingly, an organic transistor is manufactured. The semiconductor layer 11 may be evaporated by using a mask.

Pentacene can be purified by in-situ by being formed by an evaporation method, and purity of a material is improved.

In addition, a conductive layer can be selected without being restricted by a work function in the present invention; therefore, if the gate electrode 15 and the conductive layers 17a and 17b are formed by selecting aluminum as a material and by evaporating, formation of all of the layers other than the insulating layer 12 can be performed by an evaporation method.

As for a manufacturing method of FIGS. 1B to 1D, there is no big difference except that a manufacturing order is changed, and the organic transistor shown in FIGS. 1B to 1D can be manufactured in the similar manner.

When a drain current in a case of applying gate voltage to a manufactured p-type organic transistor is measured to obtain electric field effect mobility, excellent transistor characteristics can be obtained. More excellent transistor characteristics can be obtained compared with a transistor in which a composite layer is not used for parts of a source electrode and a drain electrode.

Note that, in a case where an organic transistor is manufactured, in which an edge surface of a conductive layer or a semiconductor layer of an organic transistor is covered with a composite layer, the organic transistor can be manufactured by changing a shape of a mask which forms the composite layer.

Embodiment Mode 5

A manufacturing method of an organic transistor in which an organic compound used for a composite layer and an organic semiconductor material used for a semiconductor layer are the same will be hereinafter described with reference to FIGS. 3A to 3E.

A gate electrode 15 formed from tungsten is deposited to be 100 nm on a quartz substrate 16, an insulating layer 12 formed from silicon dioxide ($SiO_2$) is deposited to be 100 nm as a gate insulating layer on the gate electrode 15, and conductive layers 17a and 17b formed from tungsten are deposited to be 100 nm on the insulating layer 12. Then, as composite layers 13a and 13b over the conductive layers 17a and 17b, molybdenum oxide (VI) and TPD (N,N'-bis(3-methylphenyl)-N,N'-diphenyl-[1,1'-biphenyl]-4,4'-diamine) which is an aromatic amine compound are deposited to be 100 nm by co-evaporation so that a molar ratio becomes 1 to 1, and a source electrode and a drain electrode formed from the conductive layers 17a and 17b and the composite layer 13a and 13b are formed. Thereafter, TPD is deposited between the source electrode and the drain electrode by evaporation as a semiconductor layer 11, and accordingly, an organic transistor is manufactured. Any of the materials shown in Embodiment Mode 1 may be used as an organic compound which is used for a semiconductor material and a composite layer. For example, in a case where the semiconductor layer 11 is formed from pentacene, pentacene is used as an organic compound which is used for the composite layers.

As for the organic transistor having such a structure in this embodiment mode, a material of the semiconductor layer 11 and a material of an organic compound which is used for the composite layers 13a and 13b are the same; therefore, adhesion between the composite layers 13a and 13b and the semiconductor layer 11 is improved. Generation of a defect due to pealing which occurs between the semiconductor layer and the source electrode or the drain electrode can be effectively reduced.

Note that since a manufacturing method is the same as the manufacturing method in Embodiment Mode 3, the description thereof is omitted.

When a drain current in a case of applying gate voltage to a manufactured p-type organic transistor is measured to obtain electric field effect mobility, excellent transistor characteristics can be obtained. More excellent transistor characteristics can be obtained compared with a transistor in which a composite layer is not used for parts of a source electrode and a drain electrode.

Note that, in a case where an organic transistor is manufactured, in which an edge surface of a conductive layer or a semiconductor layer of an organic transistor is covered with a composite layer, the organic transistor can be manufactured by changing a shape of a mask which forms the composite layer.

Embodiment Mode 6

In this embodiment mode, an organic transistor having another structure of the present invention will be described with reference to FIGS. 8A to 8D, FIGS. 9A to 9D, and FIGS. 10A to 10D. FIGS. 8A to 8D correspond to FIGS. 1A to 1D, FIGS. 9A to 9D correspond to FIGS. 2A to 2D, and FIGS. 10A to 10D correspond to FIGS. 2A to 2D, respectively.

A structure of this embodiment mode is a structure in which buffer layers 14a and 14b are provided between composite layers 13a and 13b and a semiconductor layer 11 in FIGS. 8A to 8D, and a structure in which buffer layers 14c and 14d are provided between composite layers 13c and 13d and a semiconductor layer 11 in FIGS. 9A to 9D and FIGS. 10A to 10D. The buffer layers 14a, 14b, 14c, and 14d are preferably formed by 4,4'-bis{N-[4-(N,N-di-m-tolylamino)phenyl]-N-phenylamino}biphenyl (abbreviation: DNTPD), 4,4', 4"-tris[N-(3-methylphenyl)-N-phenylamino]triphenylamine (abbreviation: MTDATA), or vanadium oxide.

By forming a buffer layer, characteristics of an organic transistor can be improved.

In addition, by forming a buffer layer, reliability of an organic transistor is also improved.

This is because a depletion layer is formed by forming a buffer layer and junction of a junction type can be formed.

Since other structures, materials, and effect are based on the above described Embodiment Modes 1 to 3, the repeated description thereof is omitted.

Embodiment Mode 7

In this embodiment mode, an organic transistor having another structure of the present invention will be specifically described with reference to FIGS. 4A to 4D.

Figure 4A:
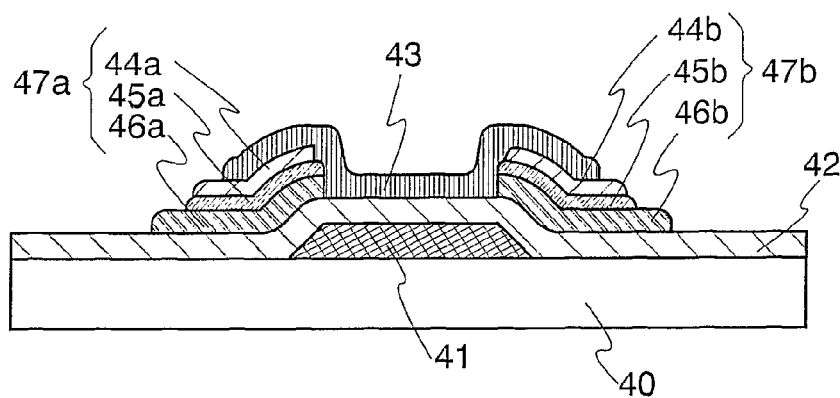
FIGS. 4A to 4D are schematic views each showing a constructional example of an organic transistor of the present invention.
Figure 4B:
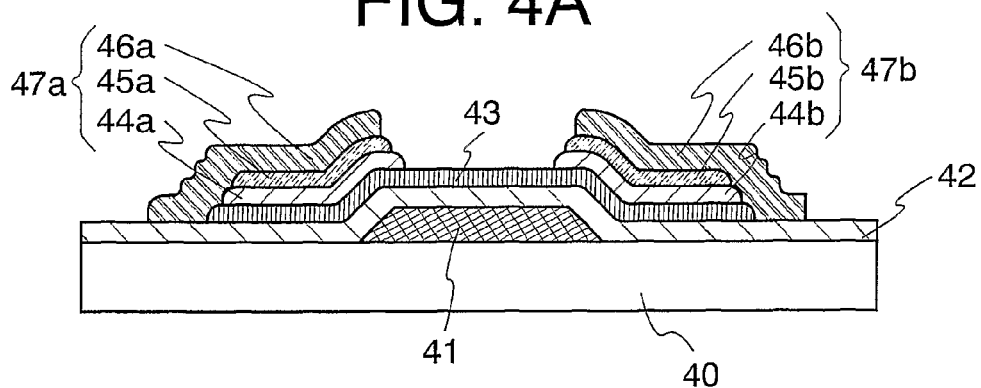
Figure 4C:
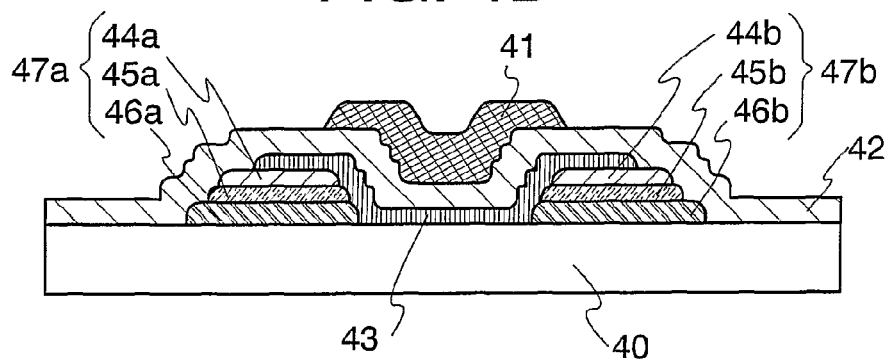
Figure 4D:
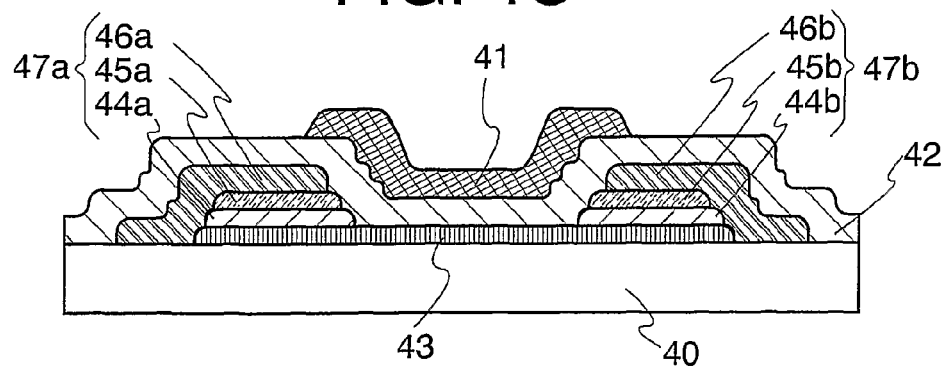

Generally, as for a transistor, a structure in which a gate electrode is formed over a semiconductor layer is referred to as a top gate structure, whereas a structure in which a gate electrode is formed below a semiconductor layer is referred to as a bottom gate structure. In addition, as for an organic transistor, a structure in which a source electrode and a drain electrode are formed over a semiconductor layer is referred to as a top contact structure, whereas a structure in which a source electrode and a drain electrode are formed below a semiconductor layer is referred to as a bottom contact structure. A structure of a transistor is appropriately selected in accordance with performance and the like which are required. FIG. 4A is an example of a bottom gate and a bottom contact type organic transistor, whereas FIG. 4B is an example of a bottom gate and a top contact type organic transistor. In addition, FIG. 4C is an example of a top gate and a bottom contact type organic transistor, whereas FIG. 4D is an example of a top gate and a top contact type organic transistor.

An organic transistor of this embodiment mode includes a substrate 40, a gate electrode 41, an insulating layer 42, a semiconductor layer 43 containing an organic semiconductor material, and source and drain electrodes 47a and 47b. The source and drain electrodes 47a and 47b include first composite layers 44a and 44b, second composite layers 45a and 45b, and conductive layers 46a and 46b. The substrate, the gate electrode, the insulating layer, the semiconductor layer, the conductive layer, and the like may be the same as those in Embodiment Mode 1. Note that structure such as an arrangement of each layer and electrode of the organic transistor can be appropriately changed.

As the substrate 40, a glass substrate, a quartz substrate, an insulating substrate such as a crystalline glass, a ceramic substrate, a stainless steel substrate, a metal substrate (such as tantalum, tungsten, or molybdenum), a semiconductor substrate, a plastic substrate (such as polyimide, acrylic, polyethylene terephthalate, polycarbonate, polyalylate, or polyether sulfone), or the like can be used. Also, these substrates may be used after being polished by CMP or the like, if necessary.

The insulating layer 42 can be formed by using an inorganic insulating material such as silicon oxide, silicon nitride, silicon oxide containing nitrogen, or silicon nitride containing oxygen; an organic insulating material such as acrylic or polyimide; and the like. Besides, the insulating layer 42 can be formed by using a so-called siloxane based material in which a skeleton structure is formed by a bond of silicon and oxygen, in which, as a substituent, an organic group containing at least hydrogen (such as an alkyl group or aromatic hydrocarbon), a fluoro group, or an organic group and a fluoro group containing at least hydrogen is included. In addition, the insulating layer 42 may be a single layer or a multilayer of two or more layers.

Note that the insulating layer may be formed by a coating method such as a dipping method, a spin coating method, a droplet discharging method, a cast method, a spinner method, and a printing method; a CVD method; a sputtering method; and the like. Also, in a case where an organic insulating material or a siloxane based material is deposited by a coating method, concavity and convexity of a bottom layer can be reduced, and improvement of wettability and favorable alignment of an organic semiconductor material which is formed over an insulating layer can be obtained.

Any of a low molecular compound, a middle molecular compound, and a high molecular compound can be used for the semiconductor layer 43 as long as it is an organic material which has a carrier transporting property and in which carrier density can be changed by electric field effect. The types of the material are not particularly limited; however, a polycyclic aromatic compound, a conjugated double bond compound, a macroring compound, a metallophthalocyanine complex, a charge transfer complex, condensed ring tetracarboxylic diimide, oligothiophene, fullerene, carbon nanotube, and the like can be given. For example, polypyrrole, polythiophene, poly(3 alkylthiophene), polyisothianaphthene, polythienylenevinylene, poly(p-phenylenevinylene), polyaniline, polydiacetylene, polyazulene, polypyrene, polycarbazole, polyselenophene, polyfuran, poly(p-phenylene), polyindole, polypyridazine, naphthacene, hexacene, heptacene, pyrene, chrysene, perylene, coronene, terrylene, ovalene, quaterrylene, circumanthracene, triphenodioxazine, triphenoditiazine, hexacene-6, 15-quinone, polyvinylcarbazole, polyphenylenesulfide, polyvinylenesulfide, polyvinylpyridine, naphthalenetetracarboxylic diimide, anthracenetetracarboxylic diimide, C60, C70, C76, C78, C84, and a derivative of these materials can be used. As a specific example of these materials, there are tetracene, pentacene, sexythiophene (6T), a,w-dihexyl-sexythiophene, copper phthalocyanine, 5-benzylidene-2,4-dioxotetrahydro-1,3-thiazole, bis-(1,2,5-thiadiazolo)-p-quinobis(1,3-dithiol), di(4-biphenyl)-α-thiophene, di(4-biphenyl)-α-bithiophene, di(4-biphenyl)-α-terthiophene, di(4-biphenyl)-α-quaterthiophene, dihexylanthradithiophene, rubrene, dihexyl-α-tetrathiophene, dihexyl-α-pentathiophene, poly(2,5-thienylenevinylene) (abbreviation: PTV), poly(3-hexylthiophene-2,5-diyl) (abbreviation: P3HT), poly (9,9'-dioctyl-fluorene-co-bithiophene) (abbreviation: F8T2) which are generally referred to as P-type semiconductor; 7,7,8,8-tetracyanoquinodimethane (abbreviation: TCNQ), 3,4,9,10-perylenetetracarboxylicdianhydride (abbreviation: PTCDA), 1,4,5,8-naphthalenetetracarboxylicdianhydride (abbreviation: NTCDA), 11,11,12,12-tetracyano-1,4-naphthaquinodimethane (abbreviation: TCNNQ), N,N'-dioctyl-3,4,9,10-perylenetetracarboxylicdiimide (abbreviation: PTCDI-C8H), copper16phthalocyaninefluoride (abbreviation: F16CuPc), N,N'-2,2,3,3,4,4,5,5,6,6,7,7,7-di15hexylfluoride-1,4,5,8-naphthalenetetracarboxylicdiimide (abbreviation: MTCDI-C8F), α,ω-perfluorohexylsexythiophene (abbreviation: DFH-6T), 3',4'-dibutyl-5,5"-bis(dicyanomethylene)-5,5"-dihydro-2,2':5',2"-terthiophen) (abbreviation: DCMT), methanofullerene[6,6]-phenyl C61 butyric acid methyl ester (abbreviation: PCBM); and the like. Note that characteristics of P-type or N-type in an organic semiconductor are not peculiar to the substance, but depend on a relation with an electrode which injects carriers or intensity of an electric field when carriers are injected. Therefore, the semiconductor material can be P-type, N-type, or bipolar type, while it has a tendency to easily become either P-type or N-type.

Note that the semiconductor layer 43 may be formed using these organic materials by an evaporation method, a spin coating method, a droplet discharging method, or the like.

Metal, an alloy, an electric conductive compound, and mixture metal, a compound, and an alloy of these can be used for the gate electrode 41. For example, metals such as sodium, magnesium, aluminum, calcium, titanium, chromium, cobalt, nickel, copper, molybdenum, barium, tantalum, tungsten, platinum, gold, or neodymium, and an alloy containing these metals are given. Besides, a conductive high molecular compound such as polyaniline, polypyrrole, polythiophene, polyacetylene, or polydiacetylene; inorganic semiconductor such as silicon, germanium, or gallium arsenic; and the conductive high molecular compound and the inorganic semiconductor doped with acid (including Lewis acid), a halogen atom, a metallic atom of alkali metal, alkaline earth metal, or the like can be given. Metal is generally used as a material of an electrode; however, the material is not particularly limited to metal, and any material can be used as long as it has conductivity. Note that the gate electrode 41 may be formed by a sputtering method, an evaporation method, or the like.

A composite material of an inorganic compound and an organic compound having an electron transporting property can be used for the first composite layers 44a and 44b. As the inorganic compound, alkali metal and alkaline earth metal, or oxide or nitride containing these metals is desirable. In particular, lithium, sodium, potassium, cesium, magnesium, calcium, strontium, barium, lithium oxide, magnesium nitride, and calcium nitride are preferable. Also, as the organic compound having an electron transporting property, in addition to a perylenetetracarboxylic anhydride and a derivative thereof; a perylenetetracarboxylic diimide derivative; naphthalenetetracarboxylic anhydride and a derivative thereof; a naphthalenetetracarboxylic derivative; a metallophthalocyanine derivative; and fullerene, for example, a material formed from a metal complex or the like including a quinoline skeleton or a benzoquinoline skeleton such as tris(8-quinolinolato)aluminum (abbreviation: Alq$_3$); tris(4-methyl-8-quinolinolato)aluminum (abbreviation: Almq$_3$); bis(10-hydroxybenz)[h]quinolinato)beryllium (abbreviation: BeBq$_2$); or bis(2-methyl-8-quinolinolato)-4-phenylphenolato-aluminum (abbreviation: BAlq) can be used. Besides, a material such as a metal complex including an oxazole-based or a thiazole-based ligand such as bis[2-(2-hydroxyphenyl)-benzooxazolato]zinc (abbreviation: Zn(BOX)$_2$) or bis[2-(2-hydroxyphenyl)-benzothiazolato]zinc (abbreviation: Zn(BTZ)$_2$) can also be used. Moreover, in addition to the metal complex, 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (BCP); and the like can be used. The first composite layers 44a and 44b can be formed by a co-evaporation method of alkali metal and alkaline earth metal or oxide and nitride containing these metals and an organic compound having an electron transporting property; however, the first composite layers 44a and 44b may be formed by any of a wet method or other methods.

Note that the first composite layers 44a and 44b may be formed by co-evaporation using resistance heating, co-evaporation using resistance heating evaporation and electron beam evaporation (EB evaporation), electron beam evaporation, a concurrent deposition using sputtering and resistance heating, or the like. Also, a wet method such as a sol-get method may be used.

The second composite layers 45a and 45b are layers containing an organic compound and an inorganic compound, and correspond to the composite layer described in Embodiment Mode 1. As an organic compound contained in the second composite layers 45a and 45b, arylcarbazole, aromatic hydrocarbon, or the like is used. For example, as an example of arylcarbazole, there are N-(2-naphthyl)carbazole (abbreviation: NCz), 4,4'-di(N-carbazolyl)biphenyl (abbreviation: CBP), 9,10-bis[4-(N-carbazolyl)phenyl]anthracene (abbreviation: CzBPA), 3,5-bis[4-(N-carbazolyl)phenyl]biphenyl (abbreviation: BCPBi), and 1,3,5-tris[4-(N-carbazolyl)phenyl]benzene (abbreviation: TCPB), and the like; however, the present invention is not limited thereto. In addition, as an example of aromatic hydrocarbon, there are anthracene, 9,10-diphenylanthracene (abbreviation: DPA), 2-tert-butyl-9,10-di(2-naphthyl)anthracene (abbreviation: t-BuDNA), tetracene, ruburene, pentacene, and the like; however, the present invention is not limited thereto.

Arylcarbazole which is used as an organic compound contained in the second composite layers 45a and 45b is represented by following general formulas (1) to (4).

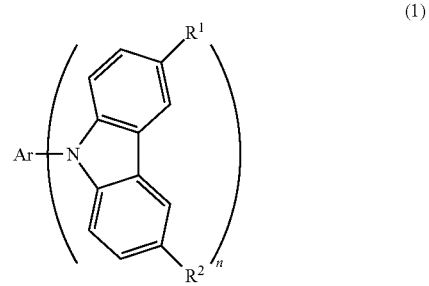

(1)

In the formula, Ar represents an aromatic hydrocarbon group having 6 to 42 carbon atoms, n represents a natural number of 1 to 3, and each of $R^1$ and $R^2$ represents any of hydrogen, an alkyl group having 1 to 4 carbon atoms and an aryl group having 6 to 12 carbon atoms.

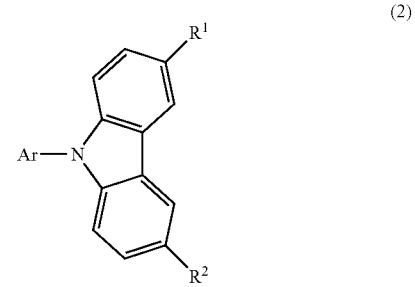

(2)

In the formula, Ar represents a monovalent aromatic hydrocarbon group having 6 to 42 carbon atoms, and each of $R^1$ and $R^2$ represents any of hydrogen, an alkyl group having 1 to 4 carbon atoms and an aryl group having 6 to 12 carbon atoms.

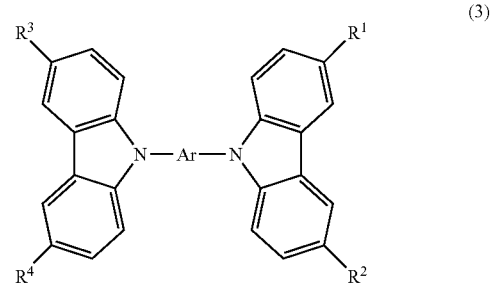

(3)

In the formula, Ar represents a divalent aromatic hydrocarbon group having 6 to 42 carbon atoms, and each of $R^1$ to $R^4$ represents any of hydrogen, an alkyl group having 1 to 4 carbon atoms and an aryl group having 6 to 12 carbon atoms.

(4)

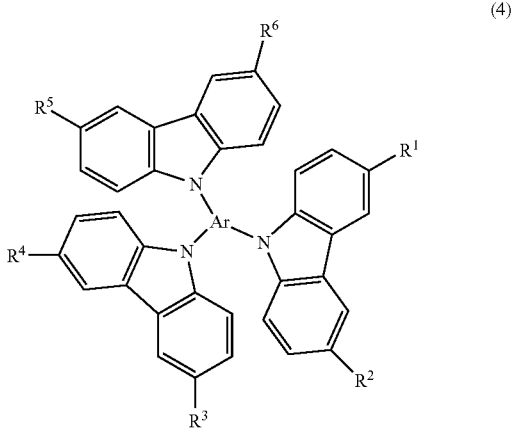

In the formula, Ar represents a trivalent aromatic hydrocarbon group having 6 to 42 carbon atoms, and each of $R^1$ to $R^6$ represents any of hydrogen, an alkyl group having 1 to 4 carbon atoms and an aryl group having 6 to 12 carbon atoms.

Further, in the above general formulas (1) to (4), an alkyl group is preferably a methyl group, an ethyl group, an iso-propyl group, or a t-butyl group, and an aryl group is preferably a phenyl group, a tolyl group, a 2-biphenylyl group, or a 4-biphenylyl group.

As an inorganic compound contained in the second composite layers 45a and 45b, oxide of transition metal is used. It is desirable to use oxide of metal belonging to Group 4 to Group 8 of the periodic table. For example, oxide of titanium, vanadium, chromium, zirconium, niobium, molybdenum, ruthenium, hafnium, tantalum, tungsten, rhenium, and the like can be given. Among these, oxide of molybdenum is easily evaporated and is stable; therefore, it is a material which is especially easy to handle.

Note that a manufacturing method of the second composite layers 45a and 45b is not limited; however, the second composite layers 45a and 45b may be formed using the above described materials of an organic compound and inorganic compound by co-evaporation using resistance heating, co-evaporation using resistance heating evaporation and electron beam evaporation (EB evaporation), electron gun evaporation, concurrent deposition using sputtering and resistance heating, or the like. The composite layers 45a and 45b may also be formed by a wet method such as a sol-gel method. In addition, a mixture ratio of the organic compound to the inorganic compound is not particularly limited; however, the mixture ratio is preferably approximately 1:0.1 to 1:10 in a molar ratio, more preferably, 1:0.5 to 1:2. In a case of forming the second composite layers 45a and 45b by co-evaporation, the mixture ratio can be controlled by adjusting evaporation rate of each organic compound and inorganic compound.

In addition, electric conductivity of the second composite layers 45a and 45b is $10^{-5}$ [S/cm], which is high, and there are few changes in resistance value of a transistor even when its thickness is changed from several nm to several hundreds nm. Therefore, the thickness of the composite layers 45a and 45b can be appropriately adjusted from several nm to several hundreds nm in accordance with an application and a shape of an element which is manufactured.

The similar material to that of the gate electrode 41 can be used for the conductive layers 46a and 46b that are part of the source electrode and the drain electrode. That is, metal, an alloy, and an electric conductive compound and mixture metal, a compound, an alloy of these can be used. For example, metal such as sodium, magnesium, aluminum, calcium, titanium, chromium, cobalt, nickel, copper, molybdenum, barium, tantalum, tungsten, platinum, gold, or neodium; an alloy containing these metals; a conductive high molecular compound such as polyaniline, polypyrrole, polythiophene, polyacetylene, or polydiacetylene; inorganic semiconductor such as silicon, germanium, or gallium arsenic; and the conductive high molecular compound and the inorganic semiconductor doped with acid (including Lewis acid), a halogen atom, a metallic atom of alkali metal or alkaline earth metal, or the like may be used. Note that metal is generally used as a material of an electrode; however, the material is not particularly limited to metal, and any can be used as long as it shows conductivity. Note that the conductive layers 46a and 46b may be formed by a sputtering method, an evaporation method, and the like similarly to the gate electrode 41.

A structure of FIG. 4B is used as an example in order to describe the present invention in more detail. The gate electrode 41 is formed on the substrate 40 in the organic transistor of FIG. 4B. The insulating layer 42 is formed on the substrate 40 and the gate electrode 41, and the semiconductor layer 43 is formed on the insulating layer 42. Moreover, the source and drain electrodes 47a and 47b are formed on the semiconductor layer 43.

The first composite layers 44a and 44b, the second composite layers 45a and 45b, and the conductive layers 46a and 46b are stacked over the semiconductor layer 43; accordingly, the source electrode and the drain electrode 47a and 47b are formed. In a case of FIG. 4B, the first composite layers 44a and 44b are formed being in contact with the semiconductor layer 43. By applying a structure in which the source electrode and the drain electrode 47a and 47b include the first composite layers 44a and 44b and the second composite layers 45a and 45b as in the present invention, an energy barrier between the semiconductor layer 43 and the source electrode and the drain electrode 47a and 47b can be reduced. Accordingly, carriers are injected smoothly from the source electrode to the semiconductor layer 43, and carriers are discharged smoothly from the semiconductor layer 43 to the drain electrode, and thus, effect to improve characteristics of an organic transistor can be obtained.

Also, as described above, since the source electrode and the drain electrode 47a and 47b include the first composite layers 44a and 44b and the second composite layers 45a and 45b, an energy barrier at the interfaces can be reduced; therefore, it is unnecessary to consider a work function of the conductive layers 46a and 46b. Accordingly, a range of material choice for an electrode is expanded, and cost can be reduced.

The composite layers 44a and 44b and the second composite layers 45a and 45b used in the present invention are chemically stable. By combining the conductive layer 46a and the conductive layer 46b, the source electrode and the drain electrode which are excellent in conductivity and can be used also as a wiring can be provided.

As described above, by using the source electrode and the drain electrode of this structure, an organic transistor in which carriers can be injected smoothly from a source electrode to a semiconductor layer and carriers can be discharged smoothly from the semiconductor layer to a drain electrode can be provided, and characteristics of an organic transistor can be improved. In particular, an n-type organic transistor in which electrons can be injected smoothly from a source electrode to a semiconductor layer and electrons can be discharged smoothly from the semiconductor layer to a drain electrode can be provided. In addition, an organic transistor having favorable carrier mobility can be provided. Moreover, an organic transistor having excellent durability can be provided.

Embodiment Mode 8

In this embodiment mode, a structure of an organic transistor, in which edge surfaces of a semiconductor layer 23 are covered with first composite layers 24a and 24b, and edge surfaces of the first composite layers 24a and 24b are covered with second composite layers 25a and 25b and so on, will be described with reference to FIGS. 5B and 5D. Note that FIGS. 5A to 5D correspond to FIGS. 4A to 4D, respectively, and in a structure of FIGS. 5A to 5D, portions other than those described are based on Embodiment Mode 7.

As for an organic transistor, depending on an organic material which is used as a semiconductor layer, there is a case where an alignment direction of the organic material highly affects a flow of carriers. Therefore, consideration is normally given to the alignment of an organic material to be aligned so that carriers easily flow in a portion where a channel is formed.

As described above, in the structure of FIGS. 5B and 5D, edge surfaces of the semiconductor layer 23 are covered with the first composite layers 24a and 24b, and edge surfaces of the first composite layers 24a and 24b are covered with the second composite layers 25a and 25b. By applying such a structure, carriers can be injected smoothly from a source electrode to a semiconductor layer, carriers can be discharged smoothly from the semiconductor layer to a drain electrode, and characteristics of an organic transistor can be improved.

Figure 5A:
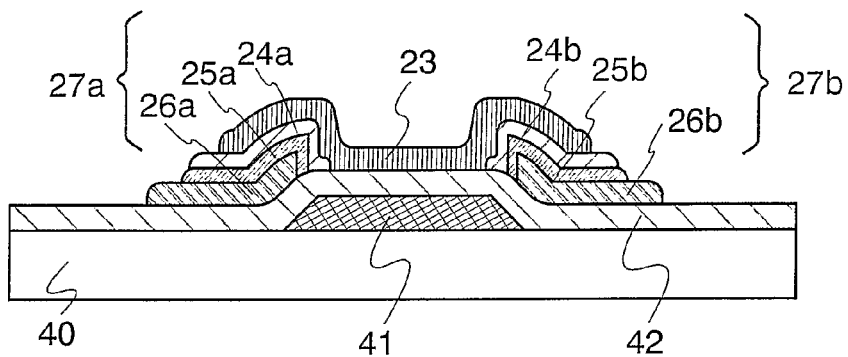
FIGS. 5A to 5D are schematic views each showing a constructional example of an organic transistor of the present invention.
Figure 5B:
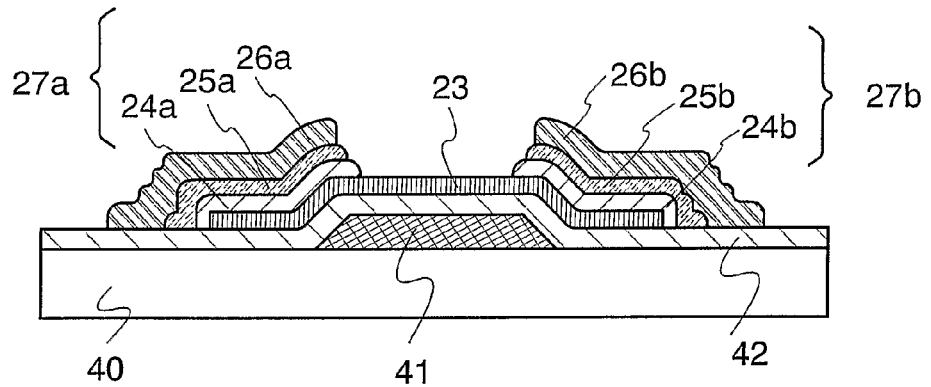
Figure 5C:
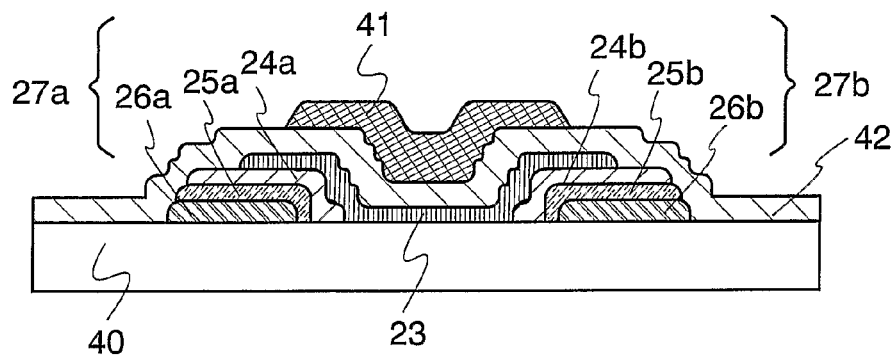
Figure 5D:
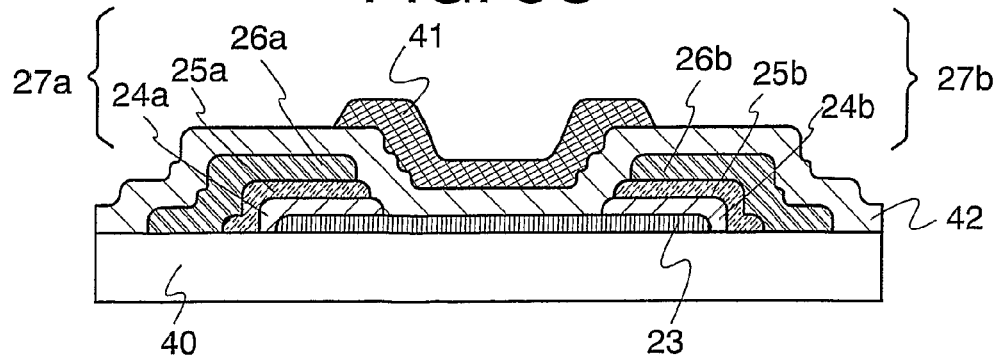
Figure 6A:
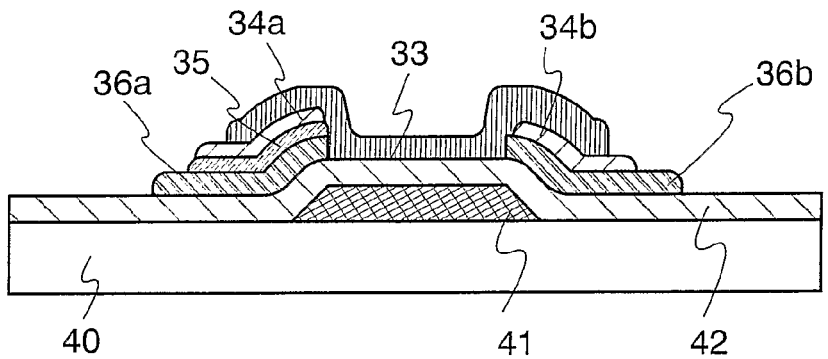
FIGS. 6A to 6D are schematic views each showing a constructional example of an organic transistor of the present invention.
Figure 6B:
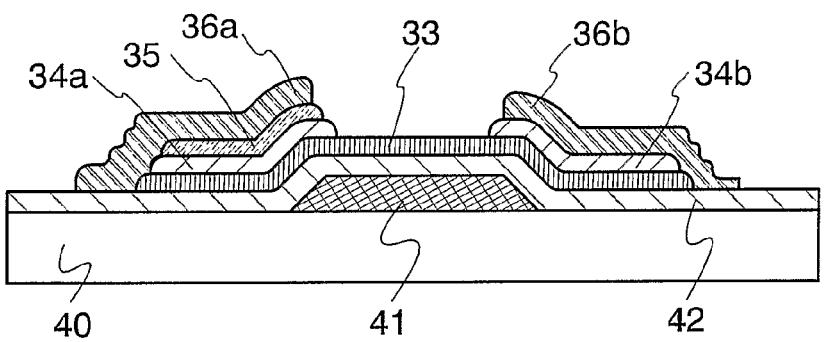
Figure 6C:
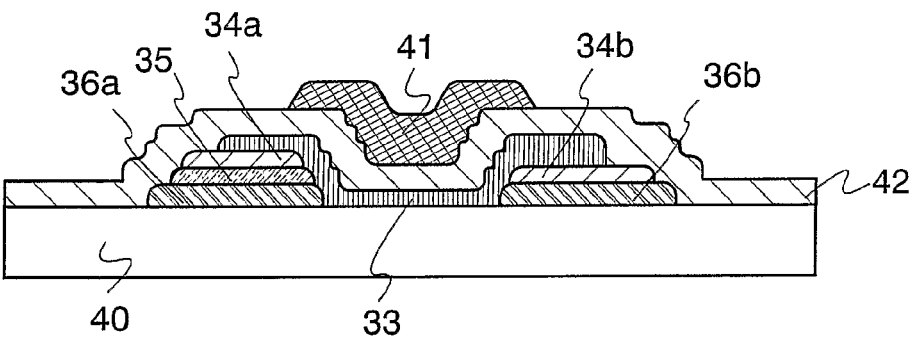
Figure 6D:
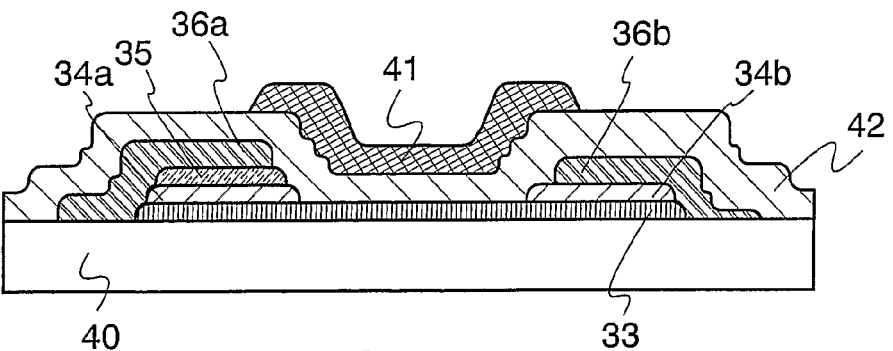
Figure 7A:
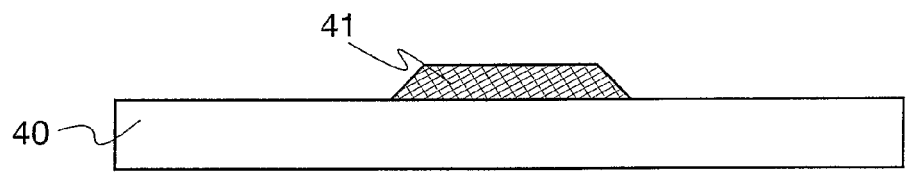
FIGS. 7A to 7F are views illustrating a manufacturing method of an organic transistor of the present invention.
Figure 7B:
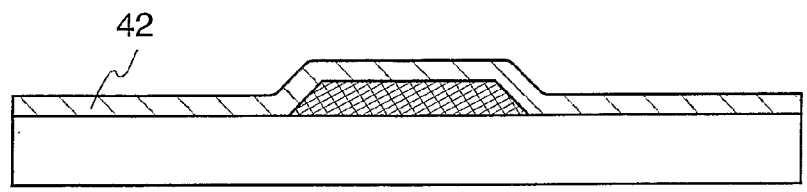
Figure 7C:
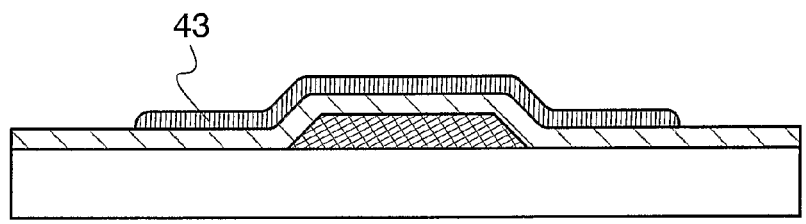
Figure 7D:
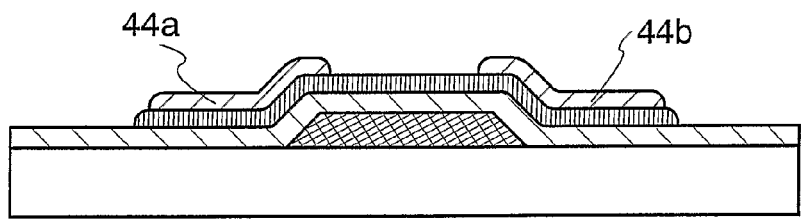
Figure 7E:
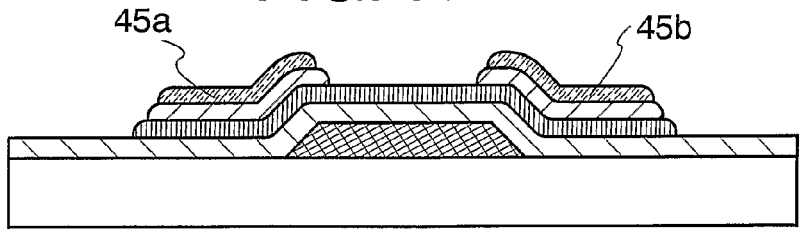
Figure 7F:
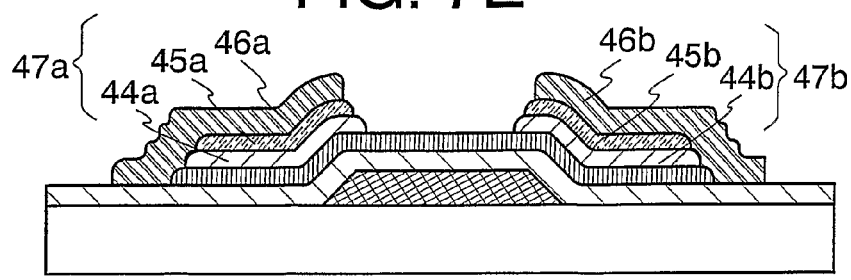
Figure 8A:
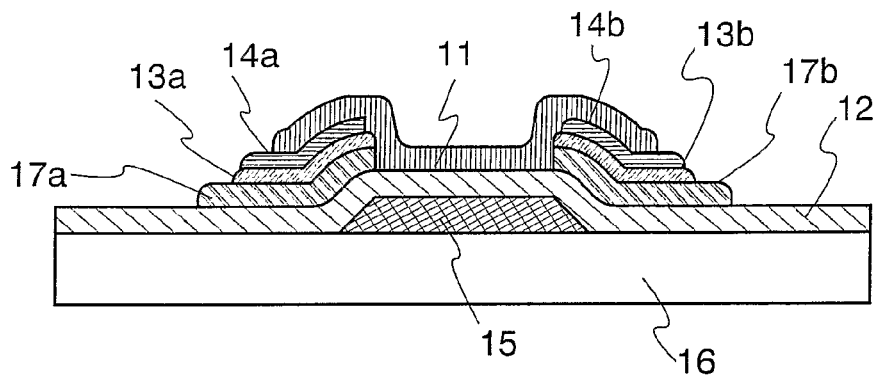
FIGS. 8A to 8D are schematic views each showing a constructional example of an organic transistor of the present invention.
Figure 8B:
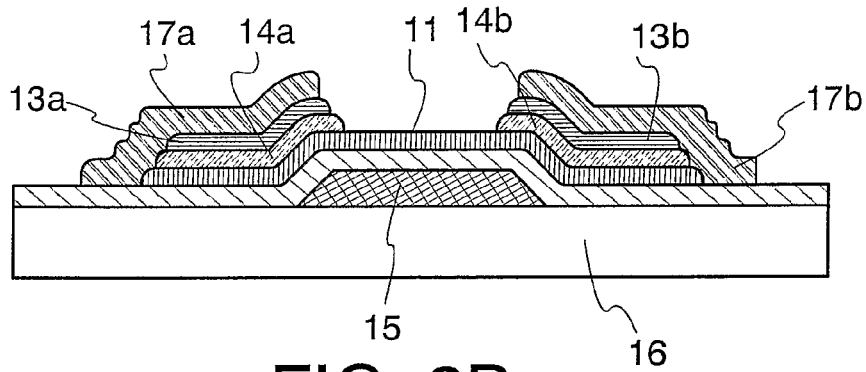
Figure 8C:
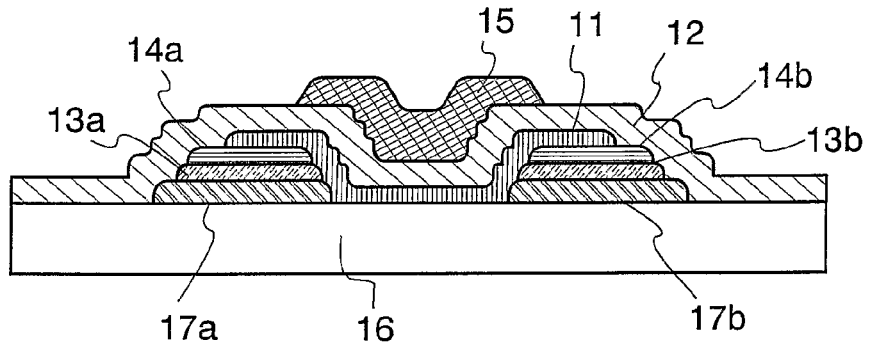
Figure 8D:
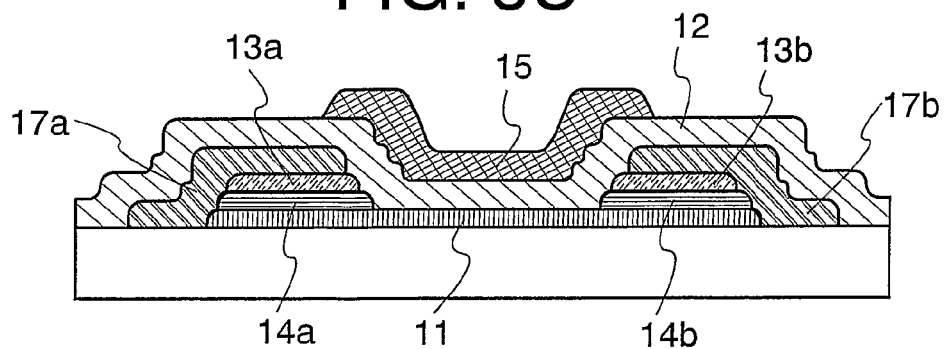
Figure 9A:
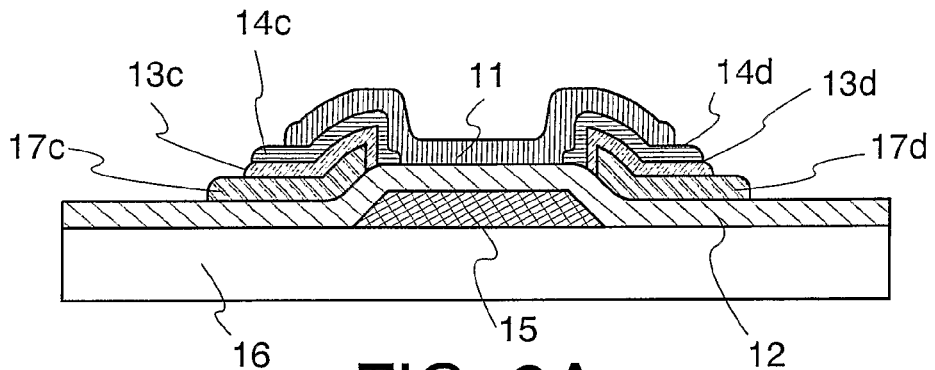
FIGS. 9A to 9D are schematic views each showing a constructional example of an organic transistor of the present invention.
Figure 9B:
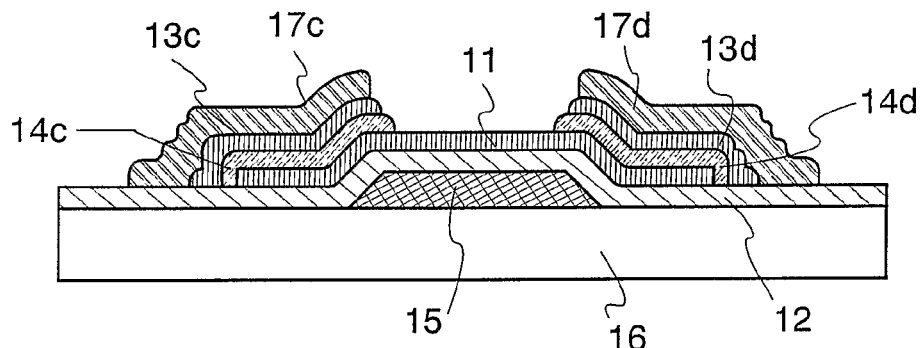
Figure 9C:
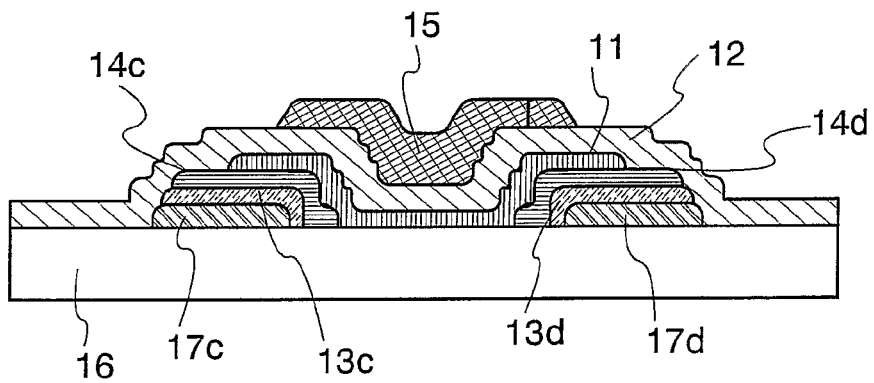
Figure 9D:
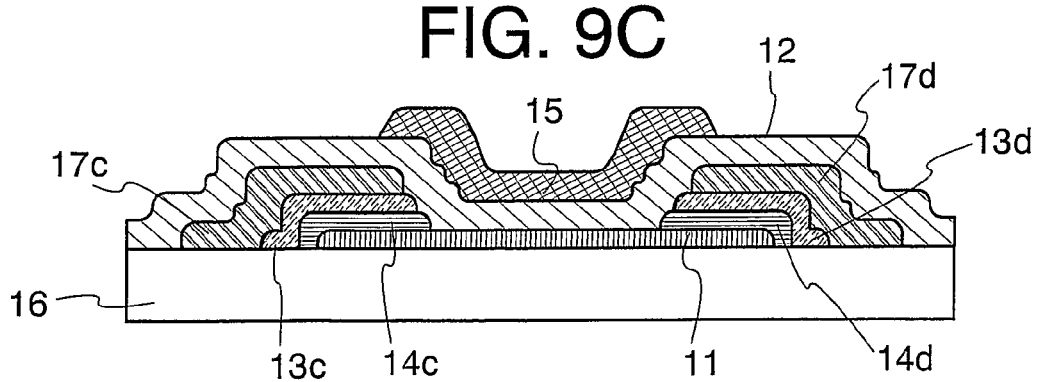
Figure 10A:
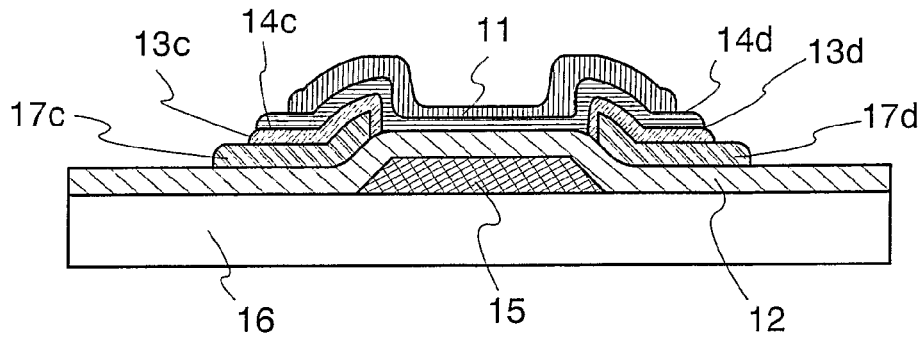
FIGS. 10A to 10D are schematic views each showing a constructional example of an organic transistor of the present invention.
Figure 10B:
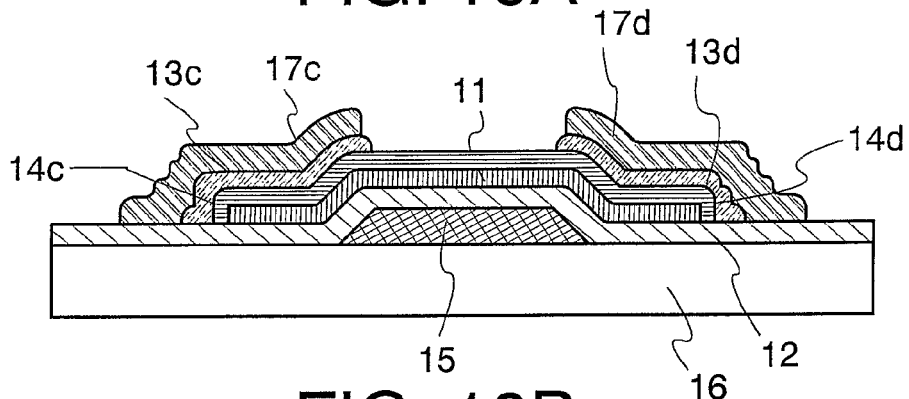
Figure 10C:
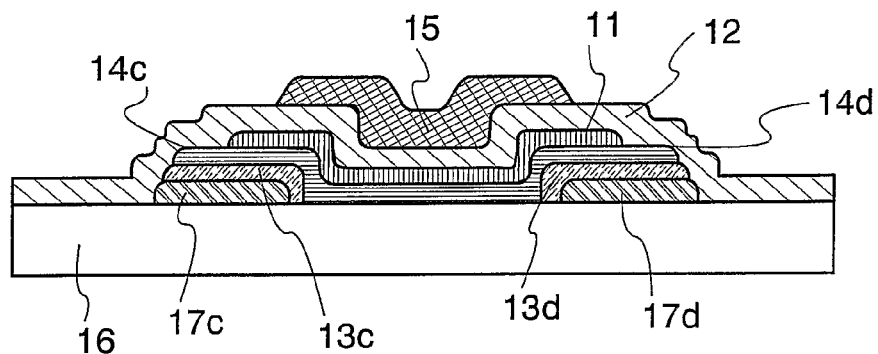
Figure 10D:
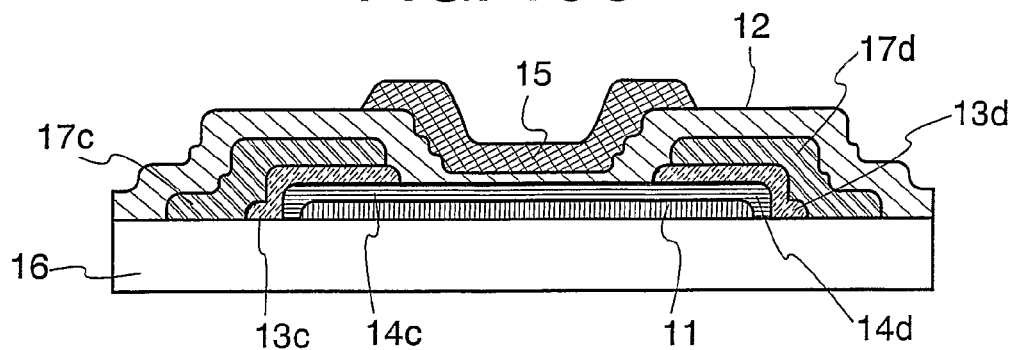

In FIGS. 5A and 5C, one edge surface of each of conductive layers 26a and 26b is covered with second composite layers 25a and 25b, and one edge surface of each of the second composite layers 25a and 25b is covered with first composite layers 24a and 24b so that the conductive layers 26a and 26b are not directly in contact with a semiconductor layer 23. By applying even such a structure, carriers can be injected smoothly from a source electrode to a semiconductor layer, carriers can be discharged smoothly from the semiconductor layer to a drain electrode, and characteristics of an organic transistor can be improved.

Embodiment Mode 9

In this embodiment mode, as shown in FIGS. 6A to 6D, one electrode of a source electrode and a drain electrode of an organic transistor has a structure in which a first composite layer 34a, a second composite layer 35, and a conductive layer 36a are stacked, and the other electrode has a structure in which a first composite layer 34b and the conductive layer 36b are stacked. Note that FIGS. 6A to 6D correspond to FIGS. 4A to 4D, respectively, and structures other than the above described source electrode and drain electrode are based on Embodiment Mode 7.

As in this embodiment mode, by applying the stacked layer structure of the first composite layer 34a, the second composite layer 35, and the conductive layer 36a to one of the electrodes, an energy barrier at an interface between the electrode and a semiconductor layer can be reduced. Accordingly, carriers can be injected smoothly from the source electrode to a semiconductor layer 33, and carriers can be discharged smoothly from the semiconductor layer 33 to the drain electrode.

Note that the structure of this embodiment mode may be applied to Embodiment Mode 8. In that case, one of the electrodes has a structure in which an edge surface of the semiconductor layer 33 is covered with the first composite layer 34a and an edge surface of the first composite layer 34a is covered with the second composite layer 35, whereas the other electrode has a structure in which an edge surface of the semiconductor layer 33 is covered with the first composite layer 34b. In addition, one of the electrodes may have a structure in which one of edge surfaces of the conductive layer 36a is covered with the second composite layer 35 and an edge surface of the second composite layer 35 is covered with the first composite layer 34a, whereas the other electrode may have a structure in which one of edge surfaces of the conductive later 36b is covered with a first composite layer 34b, so that the conductive layers 36a and 36b are not directly in contact with the semiconductor layer 33. By applying such a structure, carriers can be injected smoothly from the source electrode to the semiconductor layer, carriers can be discharged smoothly from the semiconductor layer to the drain electrode, and characteristics of an organic transistor can be improved. In particular, electrons can be injected smoothly from the source electrode to the semiconductor layer and electrons can be discharged smoothly from the semiconductor layer to the drain electrode, and operating characteristics of an n-type organic transistor can be improved.

As described above, by applying the stacked layer structure of the first composite layer 34a, the second composite layer 35, and the conductive layer 36a to one of the electrodes, an energy barrier between the electrode and the semiconductor layer 33 can be reduced. Carriers can be injected smoothly from the source electrode to the semiconductor layer 33, or carriers can be discharged smoothly from the semiconductor layer 33 to the drain electrode. Also, carrier mobility can be improved. Accordingly, operating characteristics of the organic transistor become favorable. A stacked layer structure of the first composite layer, the second composite layer, and the conductive layer is preferably applied to the source electrode and carriers may be injected smoothly from the source electrode to the semiconductor layer.

Embodiment Mode 10

In this embodiment mode, a case where the same organic compound as the semiconductor layer 43 is contained in first composite layers 44a and 44b will be described. In this embodiment mode, the same organic material is used for the first composite layers 44a and 44b and a semiconductor layer 43; therefore, advantages such as a simple manufacturing process and lower cost are obtained. Moreover, adhesion between the semiconductor layer 43 and a source electrode and a drain electrode 47a and 47b and chemical stability of an interface are improved; therefore, further improvement of transistor characteristics can be expected. In addition, improvement of durability of an organic transistor can be expected.

This embodiment mode will be described using FIG. 4B as an example. As shown in FIG. 4B, a semiconductor layer 43 is formed over a substrate 40 over which a gate electrode 41 and an insulating layer 42 are formed. Subsequently, a source electrode and a drain electrode 47a and 47b are formed over the semiconductor layer 43, and an organic transistor is manufactured. In the source electrode and the drain electrode 47a and 47b, first composite layers 44a and 44b, second composite layers 45a and 45b, and conductive layers 46a and 46b are stacked over the semiconductor layer 43. In this embodiment mode, the first composite layers 44a and 44b contain the same organic compound as that of the semiconductor layer 43.

In this manner, by applying a structure in which the first composite layers 44a and 44b and the second composite layers 45a and 45b are interposed between the semiconductor layer 43 and the conductive layers 46a and 46b, an energy barrier between the semiconductor layer 43 and the source electrode and the drain electrode 47a and 47b is reduced as already described in Embodiment Mode 7. Carriers are injected smoothly from the source electrode to the semiconductor layer, and carriers are discharged smoothly from the semiconductor layer to the drain electrode. In addition, by making an organic compound contained in the first composite layers 44a and 44b the same as an organic compound used for the semiconductor layer 43, adhesion between the semiconductor layer 43 and the source electrode and the drain electrode 47a and 47b or chemical stability of an interface thereof is improved. Accordingly, effect to reduce an energy barrier between the semiconductor layer 43 and the conductive layers 46a and 46b becomes more effective by the first composite layers 44a and 44b. In addition, durability of a transistor is also improved.

Embodiment Mode 11

In this embodiment mode, one example of a manufacturing method of an organic transistor of the present invention which is shown in FIG. 4B will be described with reference to FIGS. 7A to 7F.

First, a gate electrode 41 is formed on a substrate 40. As a material of the substrate, a glass substrate, a quartz substrate, an insulating substrate such as a crystalline glass, a ceramic substrate, a stainless steel substrate, a metal substrate (such as tantalum, tungsten, or molybdenum), a semiconductor substrate, a plastic substrate (such as polyimide, acrylic, polyethylene terephthalate, polycarbonate, polyalylate, or polyether sulfone), a film, or the like can be used. A material which can at least endure heat generated during a process is used. In this embodiment mode, a glass substrate is used.

A deposited conductive material may be processed into a desired shape by a photolithography method, and accordingly, the gate electrode 41 may be formed. The gate electrode 41 may also be formed by a droplet containing a conductive material by a droplet discharging method. Note that the manufacturing method of the gate electrode 41 of the present invention is not limited thereto. In addition, a structure of the gate electrode may be a single layer or a multilayer in which two or more layers of a conductive material are stacked. In a case of a multilayer structure, the conductive material may be appropriately selected. In this embodiment mode, tungsten is deposited to be 400 nm, and the gate electrode 41 is formed by a photolithography method.

Subsequently, an insulating layer 42 which covers the gate electrode 41 is formed. The insulating layer 42 may be formed by using an insulating layer containing silicon. For example, an inorganic insulating material such as silicon oxide, silicon nitride, silicon oxide containing nitrogen, or silicon nitride containing oxygen may be used. In addition, a so-called siloxane based material including a skeleton structure formed by a bond of silicon and oxygen, in which, as a substituent, an organic group containing at least hydrogen (such as an alkyl group or aromatic hydrocarbon), a fluoro group, or an organic group and a fluoro group containing at least hydrogen is included, may be used to form the insulating layer 42. The insulating layer of the present invention is not limited to these materials. Note that the insulating layer 42 may be a single layer or a multilayer formed of two or more layers.

The insulating layer 42 may be formed by a coating method such as a dipping method, a spin coating method, a droplet discharging method, a cast method, a spinner method, or a printing method; a CVD method; a sputtering method; or the like. Also, the insulating layer 42 may be formed by oxidizing a surface of the gate electrode by an anode oxidation method. Note that, in a case where the insulating layer 42 is formed using an organic insulating material or a siloxane based material by a coating method, concavity and convexity of the bottom layer can be reduced, and wettability and an alignment of a semiconductor layer 43 which is afterward formed over the insulating layer 42 can be favorable. In this embodiment mode, silicon diaoxide is deposited to be 400 nm to form the insulating layer 42.

Subsequently, the semiconductor layer 43 is formed on the insulating layer 42. The semiconductor layer 43 may be formed using an organic material having a carrier transporting property and in which carrier density can be changed by electric field effect, by an evaporation method, a spin coating method, a droplet discharging method, or the like. In this embodiment mode, perylenetetracarboxylic dianhydride (PTCDA) is deposited to be 50 nm using a mask by vacuum evaporation using resistance heating to form the semiconductor layer 43.

Next, first composite layers 44a and 44b, second composite layers 45a and 45b, and conductive layers 46a and 46b are stacked over the semiconductor layer 43 to form a source electrode and a drain electrode 47a and 47b, and accordingly, an organic transistor is completed. A composite material of an inorganic compound such as alkali metal and alkaline earth metal or oxide, nitride or the like containing these metals, and an organic compound having an electron transporting property is used for the first composite layers 44a and 44b. The first conductive layers 44a and 44b may be formed using a mask by co-evaporation using resistance heating, co-evaporation using resistance heating evaporation and electron beam evaporation (EB evaporation), electron gun evaporation, a concurrent deposition using sputtering and resistance heating, or the like.

The second composite layers 45a and 45b may be formed using an organic compound such as arylcarbazole or aromatic hydrocarbon and an inorganic compound such as oxide of transition metal by co-evaporation using resistance heating, co-evaporation using resistance heating evaporation and electron beam evaporation (EB evaporation), electron gun evaporation, a concurrent deposition using sputtering and resistance heating, or the like. In addition, the second composite layers 45a and 45b may also be formed by a wet method such as a sol-gel method.

The conductive layers 46a and 46b may be formed using the same conductive material as the gate electrode 41 by a sputtering method, an evaporation method, or the like. For example, the conductive material may be deposited using a mask, or the deposited conductive material may be processed into a desired shape by a photolithography method.

The first composite layers 44a and 44b, the second composite layers 45a and 45b, and the conductive layers 46a and 46b may be continuously formed using the same mask by co-evaporation using resistance heating without being exposed to the air, and accordingly, the source electrode and the drain electrode 47a and 47b are formed. A specific example is as follows. First, lithium metal and BCP which is an organic compound are co-evaporated to be 40 nm by vacuum evaporation using resistance heating so that a molar ratio becomes 1 to 1, and accordingly, the first composite layers 44a and 44b are formed. Without being exposed to the air, molybdenum oxide and CBP are co-evaporated to be 40 nm so that a molar ratio becomes 1 to 0.8, and accordingly, the second composite layers 45a and 45b are formed. Moreover, without being exposed to the air, tungsten may be co-evaporated to be 400 nm to form the conductive layers 46a and 46b, and accordingly, the source electrode and the drain electrode 47a and 47b may be formed, and an organic transistor may be completed.

In this embodiment mode, the manufacturing method of FIG. 4B is described. As for a manufacturing method of FIGS. 4A, 4C and 4D, there are few changes except that only the above described orders of the manufacturing process are changed, and the organic transistor shown in FIGS. 4A, 4C and 4D can be manufactured in the similar manner. However, in a case of FIGS. 4B and 4D, since the conductive layers 46a and 46b are formed over the semiconductor layer 43, it is preferable that the conductive layers 46a and 46b are formed by co-evaporation.

When a drain current in a case of applying gate voltage to the n-type transistor which is manufactured by the method as described above is measured to obtain mobility, excellent operating characteristics of an organic transistor can be obtained. More excellent operating characteristics can be obtained compared with an organic transistor in which a first composite layer and a second composite layer are not used for part of a source electrode and a drain electrode.

Note that the organic transistors shown in FIGS. 5A to 5D can be manufactured by changing a shape of a mask which is used when forming the first composite layers and the second composite layers.

Embodiment Mode 12

A liquid crystal device using an organic transistor of the present invention will be described with reference to FIG. 11, FIGS. 12A and 12B, and FIGS. 13A and 13B.

Figure 11:
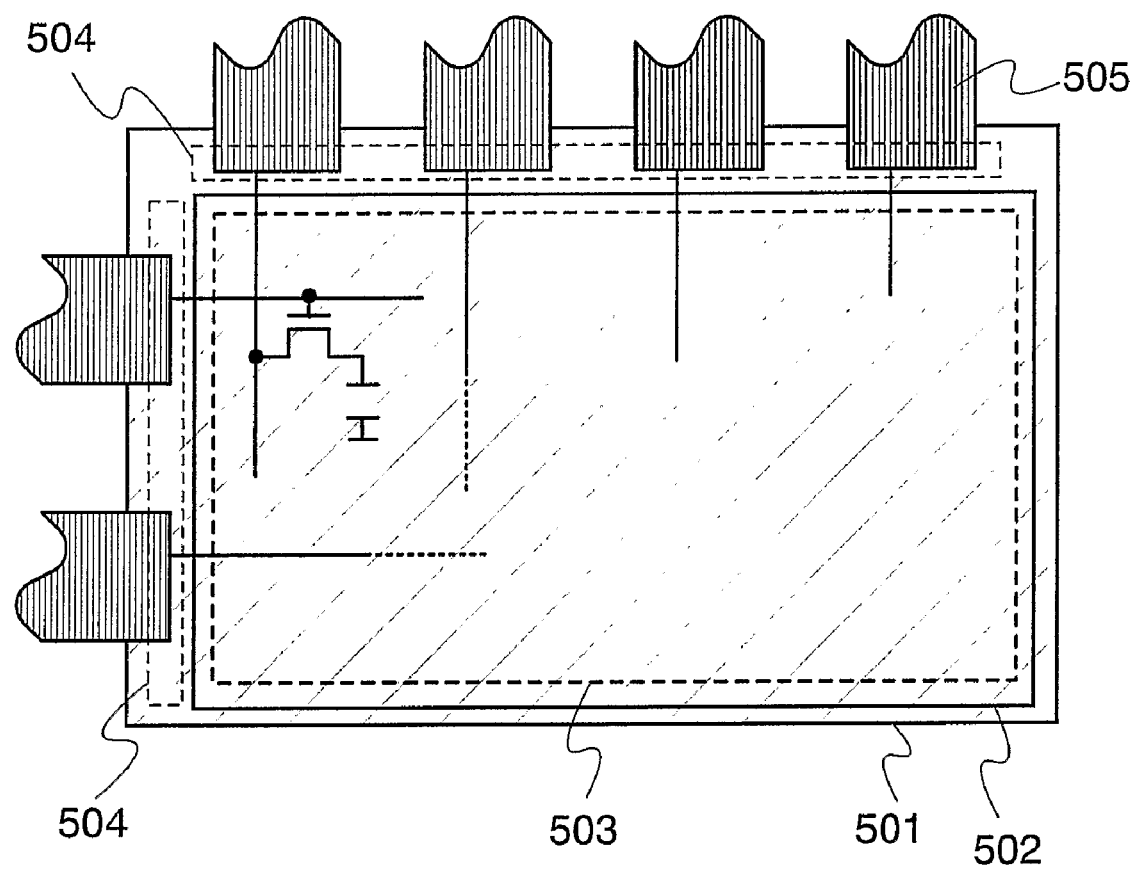
FIG. 11 is a top schematic view showing a liquid crystal display device using the present invention.

FIG. 11 is a top schematic view showing a liquid crystal display. In a liquid crystal display in this embodiment mode, a substrate 501 and a counter substrate 502 are attached to each other, and a pixel portion 503 which is formed over the substrate 501 is sealed with the counter substrate by a sealing material. A flexible printed circuit (FPC) 505 is connected to an external connection portion 504 which is provided at the periphery of the pixel portion 503, and a signal from outside is input. Note that a driver circuit and a flexible printed circuit may be independently provided as in this embodiment mode, or a driver circuit may be provided by being combined with an FPC like a TCP where an IC chip is mounted on an FPC having a wiring pattern.

The pixel portion 503 is not particularly limited. For example, the pixel portion includes a liquid crystal element and a transistor for driving the liquid crystal element as shown in cross-sectional views of FIGS. 12A and 12B and FIGS. 13A and 13B.

Figure 12A:
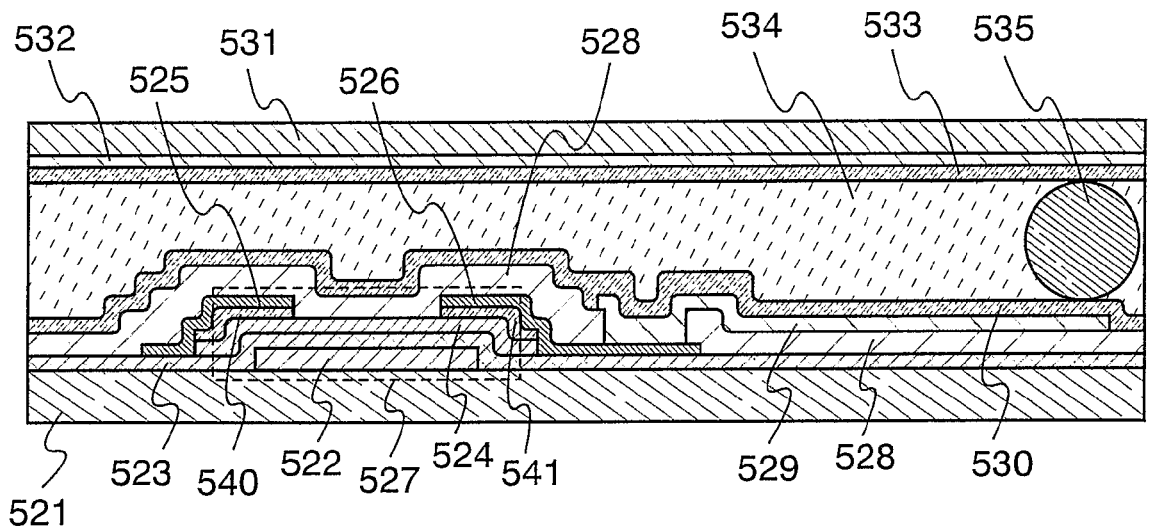
FIGS. 12A and 12B are schematic cross-sectional views each showing a liquid crystal display device using the present invention.

Similarly to the semiconductor device in Embodiment Mode 3 and so on, a liquid crystal display shown by a cross-sectional view of FIG. 12A has a substrate 521 provided with an organic transistor 527 including composite layers 540 and 541 and conductive layers 525 and 526 functioning as a source electrode or a drain electrode over a semiconductor layer 524. Here, by providing the composite layers 540 and 541 in the source electrode or the drain electrode, carriers are transported smoothly between the semiconductor layer 524 and the source electrode or the drain electrode. Also, a selection of the conductive layers 525 and 526 is not restricted by a work function; therefore, a range of material choice is expanded.

The liquid crystal element includes a liquid crystal layer 534 interposed between a pixel electrode 529 and a counter electrode 532. A surface of the pixel electrode 529 which is in contact with the liquid crystal layer 534 is provided with an alignment film 530, and a surface of the counter electrode 532 which is in contact with the liquid crystal layer 534 is provided with an alignment film 533. A spacer 535 is dispersed in the liquid crystal layer 534 to keep a cell gap. An organic transistor 527 is covered with an insulating layer 528 provided with a contact hole, and an electrode 526 and the pixel electrode 529 are electrically connected to each other. Here, the counter electrode 532 is supported by a counter substrate 531. In addition, in the organic transistor 527, the semiconductor layer 524 and a gate electrode 522 are partially overlapped with each other by having a gate insulating layer 523 sandwiched therebetween.

Figure 12B:
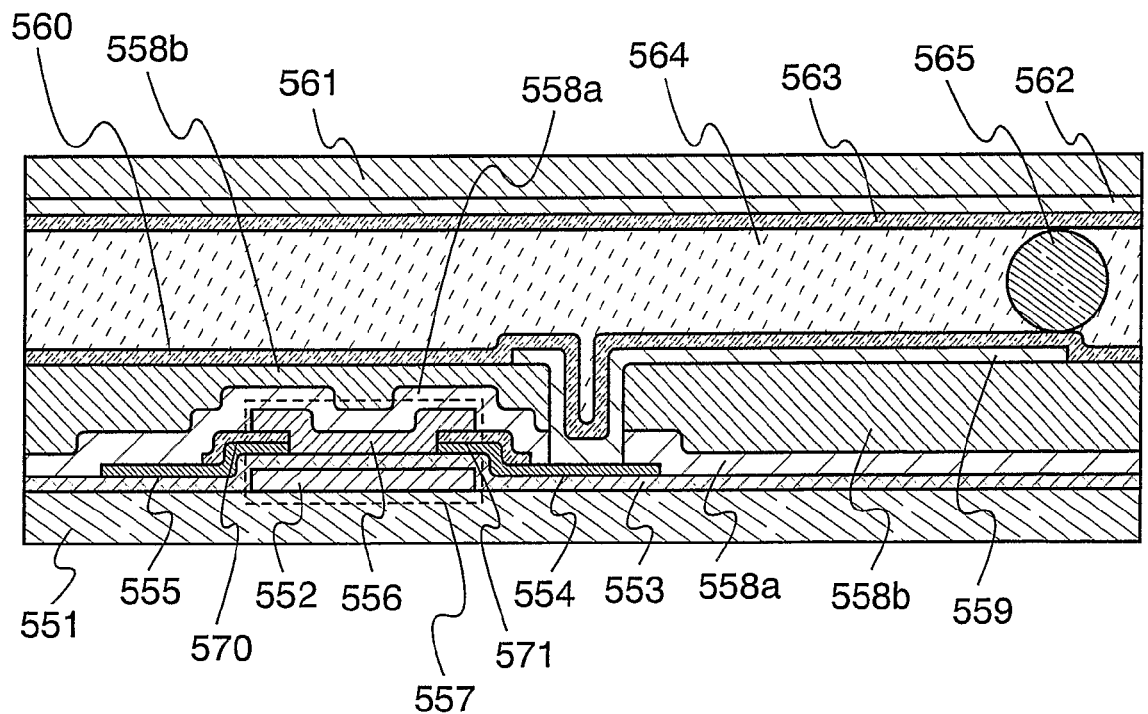

In addition, a liquid crystal device shown by a cross-sectional view of FIG. 12B has a substrate 551 on which a transistor 557 having a structure in which at least part of an electrode (including conductive layers 555 and 554 and composite layers 570 and 571) functioning as a source electrode or a drain electrode is covered with a semiconductor layer 556 is formed.

Here, by providing the composite layers 570 and 571 in the source electrode or the drain electrode, carriers are transported smoothly between a semiconductor layer 556 and the source electrode or the drain electrode. Also, a selection of the conductive layers 554 and 555 is not restricted by a work function; therefore, a range of material choice is expanded.

In addition, the liquid crystal element includes a liquid crystal layer 564 interposed between a pixel electrode 559 and a counter electrode 562. A surface of the pixel electrode 559 which is in contact with the liquid crystal layer 564 is provided with an alignment film 560, and a surface of the counter electrode 562 which is in contact with the liquid crystal layer 564 is provided with an alignment film 563. A spacer 565 is dispersed in the liquid crystal layer 564 to keep a cell gap. A transistor 557 is covered with insulating layers 558a and 558b provided with a contact hole, and the conductive layer 554 functioning as an electrode and the pixel electrode 559 are electrically connected to each other. Note that the insulating layer which covers the transistor may be a multilayer including the insulating layers 558a and 558b as shown in FIG. 12B, or a single layer including the insulating layer 528 as shown in FIG. 12A. Also, the insulating layer which covers the transistor may be a layer having a planarized surface like the insulating layer 558b. Here, the counter electrode 562 is supported by a counter substrate 561. In addition, in the transistor 557, the semiconductor layer 556 and a gate electrode 552 are partially overlapped with each other by having a gate insulating layer 553 sandwiched therebetween.

Figure 13A:
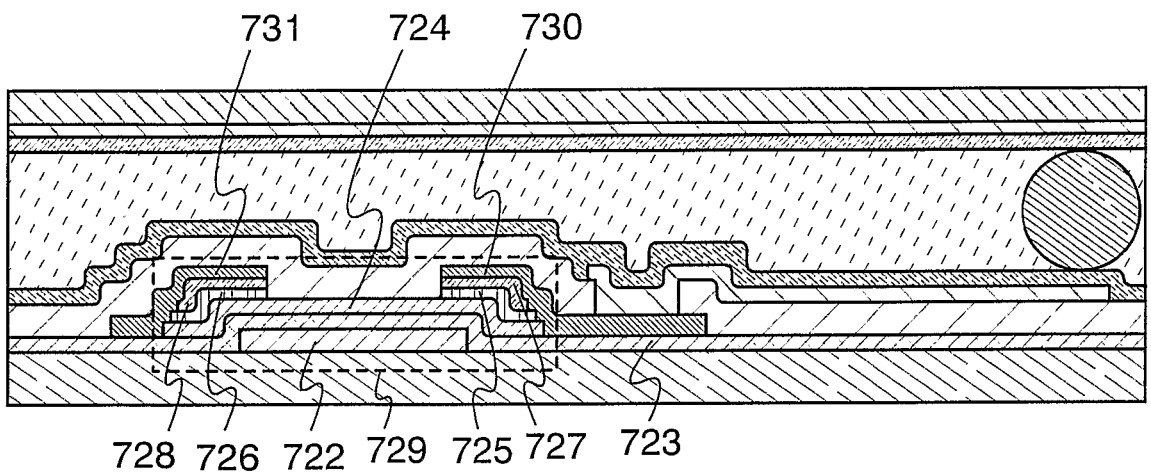
FIGS. 13A and 13B are schematic cross-sectional views each showing a liquid crystal display device using the present invention.

Similarly to the semiconductor device in Embodiment Mode 7 and so on, a liquid crystal device shown by a cross-sectional view of FIG. 13A has a substrate 521 provided with an organic transistor 729 including a source electrode and a drain electrode, which are formed of first composite layers 725 and 726, second composite layers 727 and 728, and conductive layers 730 and 731, over a gate electrode 722, an insulating layer 723, and an organic semiconductor layer 724. Here, by providing the first composite layers 725 and 726 and the second composite layers 727 and 728 in the source electrode and the drain electrode, an energy barrier at interfaces between the organic semiconductor layer 724 and the source electrode and the drain electrode is lowered, and carriers are smoothly transported at the interface. Accordingly, operating characteristics of the organic transistor 727 become favorable, and reliability of a liquid crystal display device is increased. Also, it is unnecessary to consider a work function when the conductive layers 730 and 731 are selected; therefore, a range of choice of electrode materials is expanded.

Note that other structures of FIG. 13A are the same as those of FIG. 12A; therefore, the descriptions thereof are omitted.

Figure 13B:
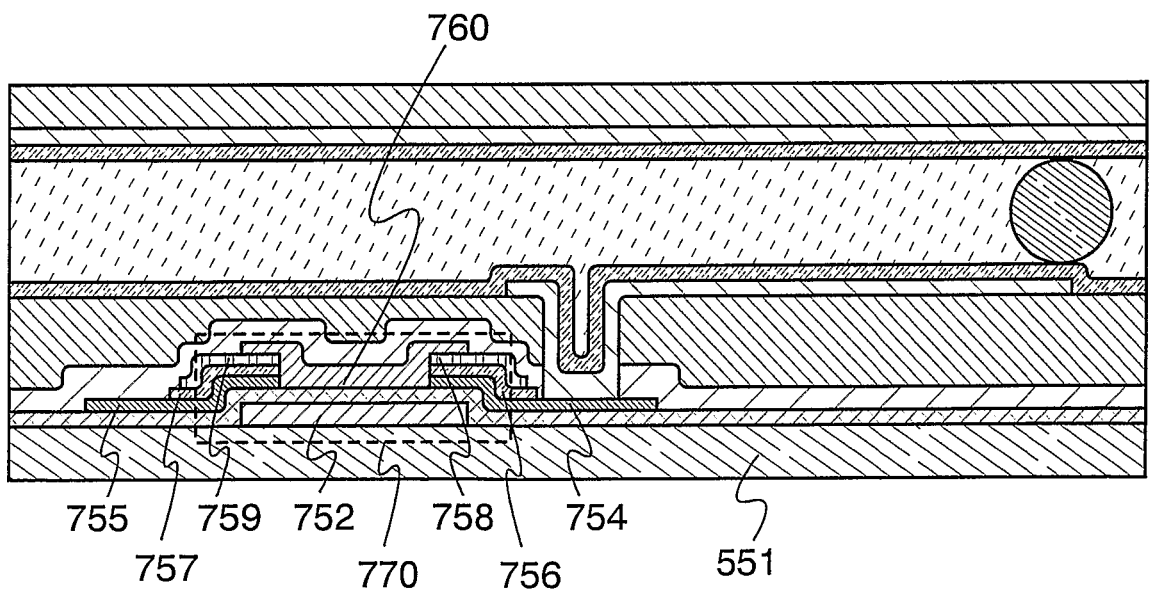

In addition, a liquid crystal device shown by a cross-sectional view of FIG. 13B has a substrate 551 on which an organic transistor 770 having a structure in which at least part of electrodes (including first composite layers 758 and 759, second composite layers 756 and 757, and conductive layers 754 and 755) functioning as a source electrode or a drain electrode are covered with an organic semiconductor layer 760 is formed.

Here, by providing the first composite layers 758 and 759 and the second composite layers 756 and 757 in the source electrode and the drain electrode, carriers are transported smoothly between the organic semiconductor layer 760 and the source electrode or the drain electrode. Also, a selection of the conductive layers 754 and 755 is not restricted by a work function; therefore, a range of choice is expanded. Note that other structures of FIG. 13B are the same as those of FIG. 12B; therefore, the descriptions thereof are omitted.

Note that a structure of the liquid crystal device is not particularly limited, and for example, a structure in which a driver circuit is provided over a substrate may also be used, in addition to the mode shown in this embodiment mode.

Figure 14A:
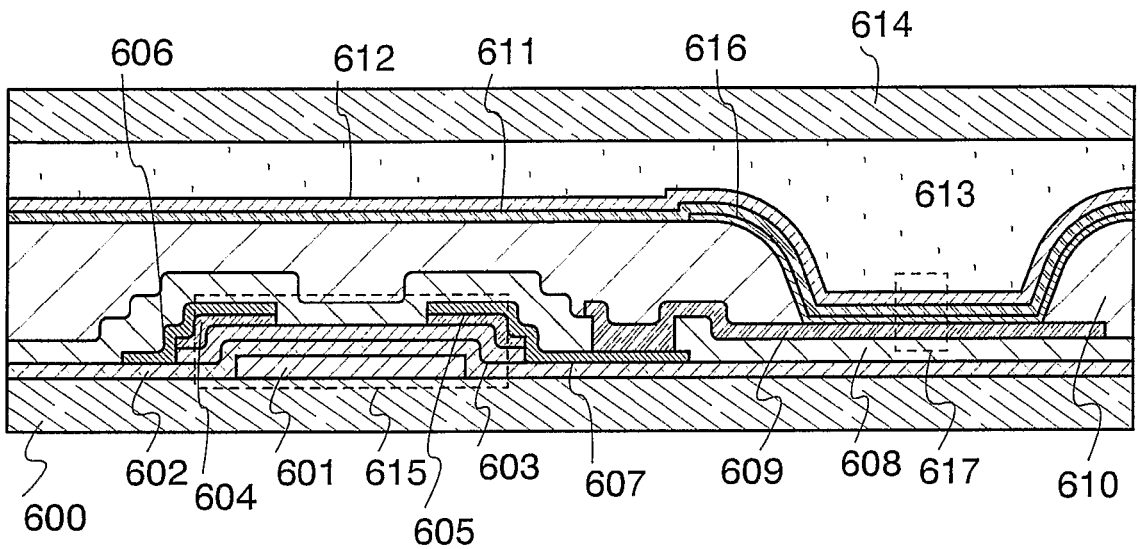
FIGS. 14A and 14B are schematic cross-sectional views each showing a liquid crystal display device using the present invention.

Subsequently, a light emitting device (an EL (electroluminescence) display device) using the organic transistor of the present invention will be described with reference to FIGS. 14A and 14B and FIGS. 15A and 15B. A light emitting element 617 which forms a pixel portion of the light emitting device includes a light emitting layer 616 interposed between a pixel electrode 609 and a common electrode 611 as shown in FIG. 14A. The light emitting layer 616 contains an organic compound as a light emitting material which becomes a light emission center. Note that the light emitting layer 616 may also contain an inorganic compound as a light emitting material which becomes a light emission center. The pixel electrode 609 is electrically connected to a conductive layer 607 which is part of an electrode of an organic transistor 615 through a contact hole which is provided in an interlayer insulating film 608 formed by covering the organic transistor 615. The electrode of the organic transistor is formed of a stacked layer of composite layers 604 and 605 and conductive layers 606 and 607. A semiconductor layer 603 is provided by the materials given in Embodiment Mode 1 such as pentacene, and part thereof is overlapped with a gate electrode 601 through a gate insulating layer 602. The gate electrode 601 is formed on a substrate 600, and the gate electrode 601 and a source electrode and a drain electrode of the organic transistor 615 are partially overlapped with each other through the gate insulating layer 602 and the semiconductor layer 603. An edge of the pixel electrode 609 is covered with the insulating layer 610, and the light emitting layer 616 is formed so as to cover a portion exposed from the insulating layer 610. Note that although a passivation film 612 is formed covering the common electrode 611, the passivation film 612 may not necessarily be formed. The substrate 600 over which these elements are formed is sealed with a counter substrate 614 outside the pixel portion by a sealing material which is not shown, and the light emitting element 617 is insulated from the outside air. A space 613 between the counter substrate 614 and the substrate 600 may be filled with inert gas such as dried nitrogen, or the space 613 may be sealed by being filled with a resin or the like instead of the sealing material.

Figure 14B:
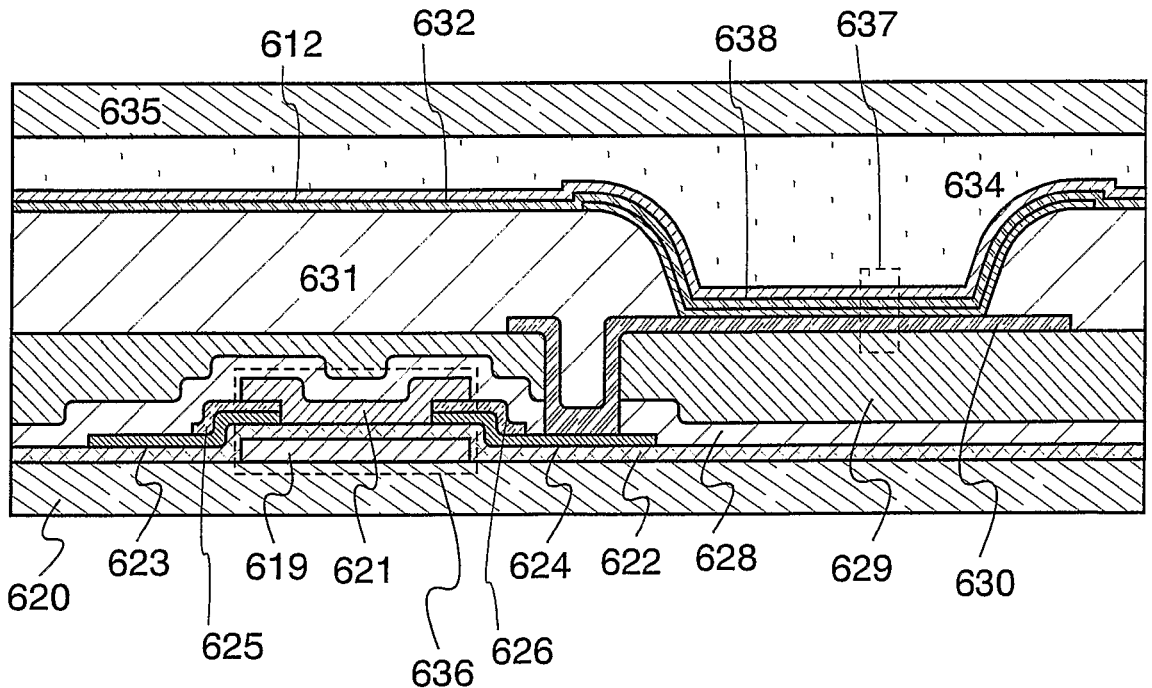

FIG. 14B is a structure of a light emitting device which is different from FIG. 14A. Similarly to FIG. 14A, a light emitting element 637 which forms a pixel portion of the light emitting device includes a light emitting layer 638 interposed between a pixel electrode 630 and a common electrode 632. The light emitting layer 638 contains an organic compound as a light emitting material which becomes a light emission center. Note that the light emitting layer 638 may contain an inorganic compound as a light emitting material which is a light emission center. The pixel electrode 630 is electrically connected to a conductive layer 624 which is part of an electrode of an organic transistor 636 through a contact hole which is provided in a first interlayer insulating film 628 and a second interlayer insulating film 629, each of which is formed by covering the organic transistor 636. An electrode of the organic transistor 636 is formed of a stacked layer of composite layers 625 and 626 and conductive layers 623 and 624. A semiconductor layer 621 is provided by materials given in Embodiment Mode 1 such as pentacene, and part thereof is overlapped with a gate electrode 619 through a gate insulating layer 622. The gate electrode 619 is formed on a substrate 620, and the gate electrode 619 and a source electrode and a drain electrode of the organic transistor 636 are partially overlapped with each other through the gate insulating layer 622. An edge of the pixel electrode 630 is covered with an insulating layer 631, and the light emitting layer 638 is formed so as to cover a portion exposed from the insulating layer 631. Note that although a passivation film 612 is formed covering the common electrode 632, the passivation film 612 may not necessarily be formed. The substrate 620 over which these elements are formed is sealed with a counter substrate 635 outside the pixel portion by a sealing material which is not shown, and the light emitting element 637 is insulated from the outside air. A space 634 between the counter substrate 635 and the substrate 620 may be filled with inert gas such as dried nitrogen, and the space 634 may be sealed by being filled with a resin or the like instead of the sealing material.

In addition, the interlayer insulating film which covers the organic transistor 636 may be a multilayer structure of the interlayer insulating films 628 and 629 as shown in FIG. 14B, or a single layer structure of only the interlayer insulating film 608 as shown in FIG. 14A. Also, the interlayer insulating film which covers the organic transistor 615 may also be a layer having a planarized surface like the interlayer insulating film 629 of FIG. 14B.

Figure 15A:
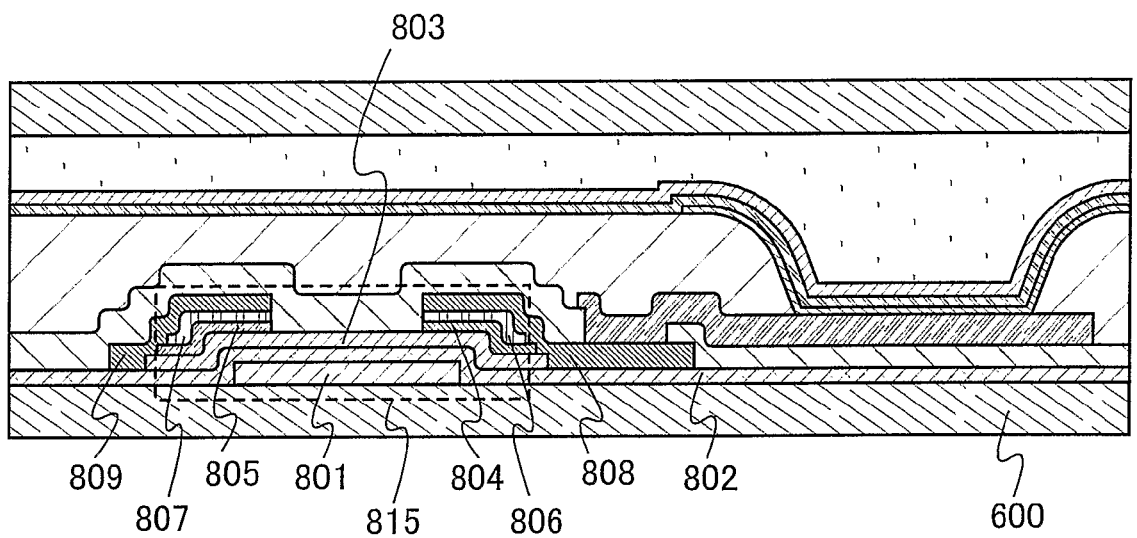
FIGS. 15A and 15B are schematic cross-sectional views each showing a liquid crystal display device using the present invention.

FIG. 15A is a structure of a light emitting device which is different from FIG. 14A. A source electrode and a drain electrode of an organic transistor 815 are formed of a stacked layer of first composite layers 804 and 805, second composite layers 806 and 807, and conductive layers 808 and 809. An organic semiconductor layer 803 is formed over a gate electrode 801 through an insulating layer 802. The gate electrode 801 is formed over a substrate 600, and the gate electrode 801 and the source electrode and the drain electrode of the organic transistor 815 are partially overlapped with each other through the insulating layer 802 and the semiconductor layer 803. Note that other structures are the same as those of FIG. 14A; therefore, the descriptions thereof are omitted.

Figure 15B:
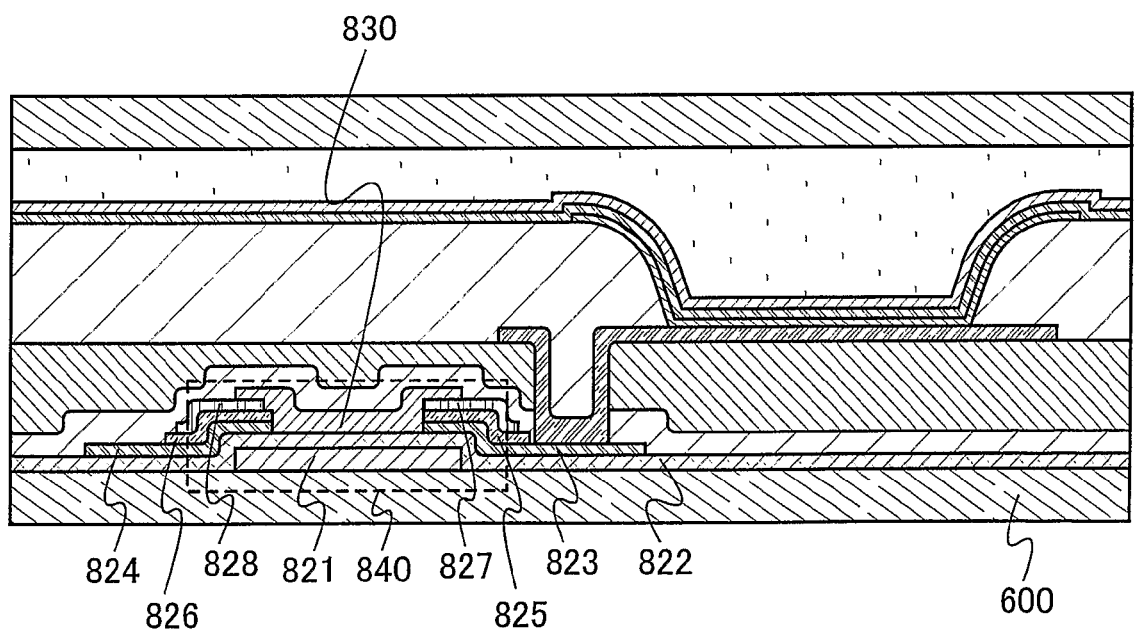

FIG. 15B is a structure of a light emitting device which is different from FIG. 14B. A source electrode and a drain electrode of an organic transistor 840 are formed of a stacked layer of first composite layers 827 and 828, second composite layers 825 and 826, and conductive layers 823 and 824. An organic semiconductor layer 830 is partially overlapped with a gate electrode 821 through an insulating layer 822. The gate electrode 821 is formed over a substrate 600, and the gate electrode 821 and the source electrode and the drain electrode of the organic transistor 840 are partially overlapped with each other through the insulating layer 822. Note that other structures are the same as those of FIG. 14B; therefore, the descriptions thereof are omitted.

Note that the structure of the light emitting device and the organic transistor of the present invention included in the light emitting device are not limited to the above described structure. For example, a structure in which a driver circuit is provided over a substrate may also be used, in addition to the mode shown in this embodiment mode.

The display device as described above can be used as a display device which is mounted on a telephone set, a television set, and the like. In addition, the display device may also be mounted on a card having a function to manage personal information such as an ID card.

Figure 16A:
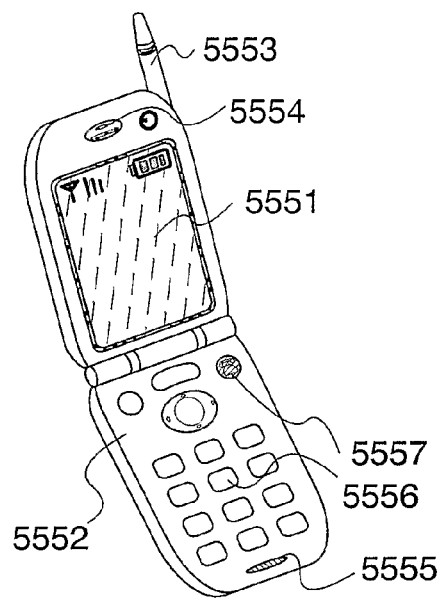
FIGS. 16A to 16C are views of electronic devices using the present invention.

FIG. 16A shows a telephone set of the present invention, which includes a main body 5552 having a display portion 5551, an audio output portion 5554, an audio input portion 5555, operating switches 5556 and 5557, an antenna 5553, and the like. The telephone set has excellent operating characteristics and high reliability. Such a telephone set can be completed by incorporating the organic transistor described in Embodiment Modes 1 to 3 and so on into the display portion.

Figure 16B:
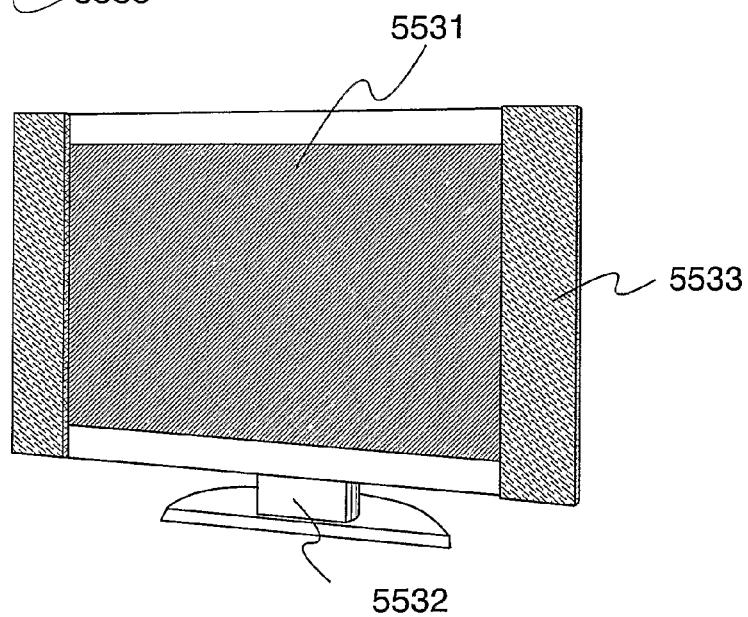

FIG. 16B shows a television set of the present invention, which includes a display portion 5531, a housing 5532, a speaker 5533, and the like. The television set has excellent operating characteristics and high reliability. Such a television set can be completed by incorporating the light emitting device including the organic transistor described in Embodiment Modes 1 to 3 and so on into the display portion.

Figure 16C:
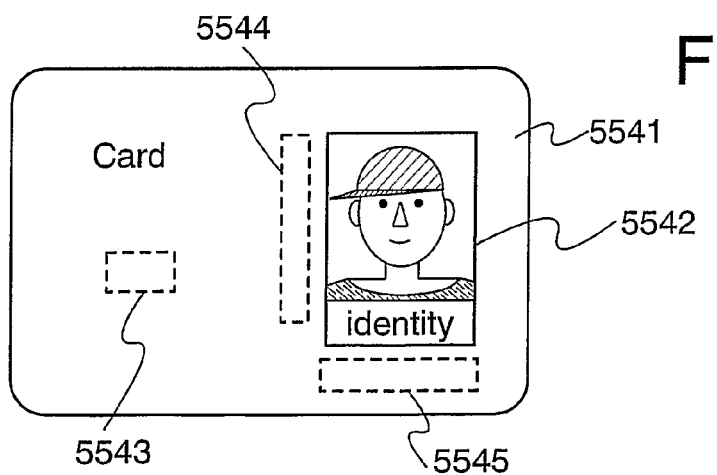

FIG. 16C shows an ID card of the present invention, which includes a supporting body 5541, a display portion 5542, an integrated circuit chip 5543 which is incorporated into the supporting body 5541, and the like. Further, integrated circuits 5544 and 5545 for driving the display portion 5542 are also incorporated into the supporting body 5541. The ID card has high reliability. In addition, for example, information which is input into or output from the integrated circuit chip 5543 can be displayed and the information can be recognized by the display portion 5542. Such an ID card can be obtained by incorporating the light emitting device including the organic transistor described in Embodiment Modes 1 to 3 and so on as the display portion and applying the organic transistor described in Embodiment Modes 1 to 3 and so on to the integrated circuits 5544 and 5545.

Embodiment Mode 13

An example, in which the organic transistor described in Embodiment Modes 1 to 12 is applied to a display device having flexibility as another embodiment mode of the present invention, will be described with reference to FIG. 17.

Figure 17:
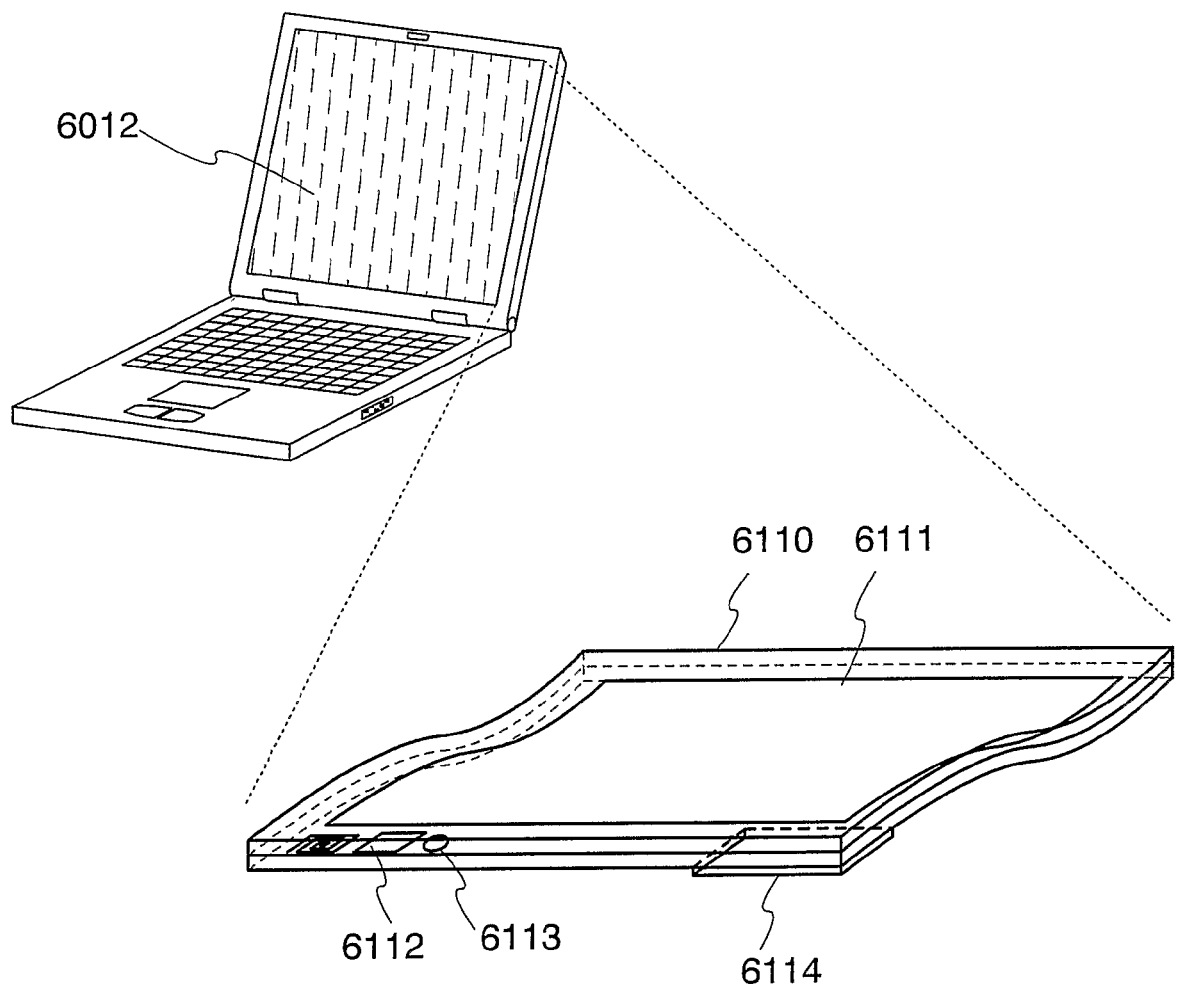
FIG. 17 is a view of an electronic device using the present invention.

A display device shown in FIG. 17 may be included in a housing, and the display device contains a main body 6110, a pixel portion 6111 which displays an image, a driver IC 6112, a receiver device 6113, a film battery 6114, and the like. The driver IC 6112, the receiver device 6113, and the like may be incorporated by using a semiconductor part. The main body 6110 of the display device of the present invention is formed using a material having flexibility such as a plastic or a film. Such a material is usually thermally fragile; however, by forming a transistor of a pixel portion by using the organic transistor described in Embodiment Modes 1 to 12, it becomes possible to form a display device by using such a material which is thermally fragile. In addition, a computer having favorable electric characteristics such as a threshold value and high reliability can be obtained. Moreover, by using a paper display for a display portion 6012, it is possible to obtain a computer in which the power consumption is lower than other display devices and the shape is thin and light, which is as easy as paper to be read.

Such a display device is extremely light and flexible; therefore, the display device can be rolled into a cylinder shape, and the display device is extremely advantageous to carry. By the display device of the present invention, a display medium of a large screen can be freely carried.

Besides, the display device can be used as a display means of a navigation system, a sound reproduction device (such as a car audio or an audio component), a personal computer, a game machine, and a portable information terminal (such as a mobile computer, a cell phone, a portable game machine, or an electric machine). Moreover, the display device can be used as a means for mainly displaying a still image for electrical home appliances such as a refrigerator; a washing machine; a rice cooker; a fixed telephone; a vacuum cleaner; a clinical thermometer, railroad wall banners, and a large-sized information display such as an arrival and departure guide plate in a railroad station and an airport.

As described above, embodiment modes which are preferable in the present invention are particularly described; however, it is easily understood by those skilled in the art that modes and details can be modified in various ways without departing from the purpose and the scope of the present invention.

This application is based on Japanese Patent Applications serial no. 2005-125811 filed on Apr. 22, 2005 and no. 2005-125904 filed on Apr. 25, 2005 in Japan Patent Office, the entire contents of which are hereby incorporated by reference.

EXPLANATION OF REFERENCE

11: semiconductor layer, 12: insulating layer, 13: composite layer, 15: gate electrode, 16: substrate, 17: conductive layer, 23: semiconductor layer, 33: semiconductor layer, 34: first composite layer, 35: second composite layer, 40: substrate, 41: gate electrode, 42: insulating layer, 43: semiconductor layer, 13*a*: composite layer, 14*a*: buffer layer, 14*c*: buffer layer, 17*a*: conductive layer, 24*a*: first composite layer, 25*a*: second composite layer, 26*a*: conductive layer, 34*a*: first composite layer, 34*b*: first composite layer, 35*a*: second composite layer, 36*a*: conductive layer, 36*b*: conductive layer, 44*a*: first composite layer, 45*a*: second composite layer, 46*a*: conductive layer, 47*a*: drain electrode, 501: substrate, 502: counter substrate, 503: pixel portion, 504: external connection portion, 521: substrate, 522: gate electrode, 523: gate insulating layer, 524: semiconductor layer, 525: conductive layer, 526: conductive layer, 527: organic transistor, 528: insulating layer, 529: pixel electrode, 530: alignment film, 531: counter substrate, 532: counter electrode, 534: liquid crystal layer, 535: spacer, 540: composite layer, 551: substrate, 552: gate electrode, 553: gate insulating layer, 554: conductive layer, 555: conductive layer, 556: semiconductor layer, 557: transistor, 559: pixel electrode, 560: alignment film, 561: counter substrate, 562: counter electrode, 564: liquid crystal layer, 565: spacer, 570: composite layer, 600: substrate, 601: gate electrode, 602: gate insulating film, 603: semiconductor layer, 604: composite layer, 606: conductive layer, 607: conductive layer, 608: interlayer insulating film, 609: pixel electrode, 610: insulating layer, 611: common electrode, 612: passivation film, 613: space, 614: counter substrate, 615: organic transistor, 616: light emitting layer, 617: light emitting element, 620: substrate, 621: semiconductor layer, 619: gate electrode, 622: gate insulating layer, 623: conductive layer, 624: conductive layer, 625: composite layer, 628: interlayer insulating film, 629: interlayer insulating film, 630, pixel electrode, 631: insulating layer, 632: common electrode, 634: space, 635: counter substrate, 636: organic transistor, 637: light emitting element, 638: light emitting layer, 722: gate electrode, 723: insulating layer, 724: semiconductor layer, 725 first composite layer, 727: second composite layer, 729: organic transistor, 730: conductive layer, 754: conductive layer, 756: second composite layer, 758: first composite layer, 760: organic semiconductor layer, 770: organic transistor, 801: gate electrode, 802: insulating layer, 803: organic semiconductor layer, 804: second composite layer, 806: first composite layer, 808: conductive layer, 815: organic transistor, 821: gate electrode, 822: insulating layer, 823: conductive layer, 825: second composite layer, 827: first composite layer, 830: organic semiconductor layer, 840: organic transistor, 5531: display portion, 5532: housing, 5533: speaker, 5541: supporting body, 5542: display portion, 5543: integrated circuit chip, 5544: integrated circuit, 5551: display portion, 5552: main body, 5553: antenna, 5554: audio output portion, 5555: audio input portion, 5556: operation switch, 558a, insulating layer, 558b: insulating layer, 6010: main body, 6111: pixel portion, 6112: driver IC, 6012: display portion, 6113: receiver device, and 6114: film battery.

The invention claimed is:
1. A semiconductor device comprising:
a semiconductor layer containing an organic semiconductor material; and
a source electrode and a drain electrode,
wherein at least one of the source electrode and the drain electrode has a composite layer containing an organic compound and an inorganic compound,
wherein the organic compound and the inorganic compound are mixed in the composite layer,
wherein the organic compound is represented by a following general formula (1),

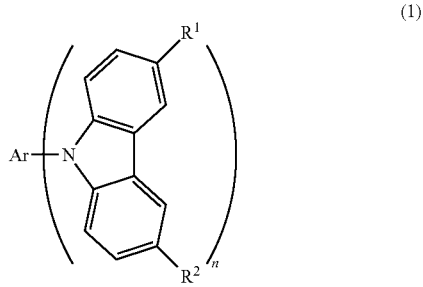

(1)

wherein Ar represents an aromatic hydrocarbon group having 6 to 42 carbon atoms,
wherein n represents a natural number of 1 to 3,
wherein each of $R^1$ and $R^2$ represents any of hydrogen, an alkyl group having 1 to 4 carbon atoms, and an aryl group having 6 to 12 carbon atoms, and
wherein the inorganic compound is a transition metal oxide.
2. The semiconductor device according to claim 1, wherein the inorganic compound is one of vanadium oxide, tantalum oxide, molybdenum oxide, tungsten oxide, rhenium oxide, and ruthenium oxide.
3. The semiconductor device according to claim 1, wherein the semiconductor device further comprises a buffer layer being in contact with the composite layer and the semiconductor layer.
4. The semiconductor device according to claim 1, wherein the organic semiconductor material is the same as the organic compound.
5. A semiconductor device comprising:
a semiconductor layer containing an organic semiconductor material; and
a source electrode and a drain electrode,
wherein at least one of the source electrode and the drain electrode has a composite layer containing an organic compound and an inorganic compound,
wherein the organic compound and the inorganic compound are mixed in the composite layer,
wherein the organic compound is represented by a following general formula (2),

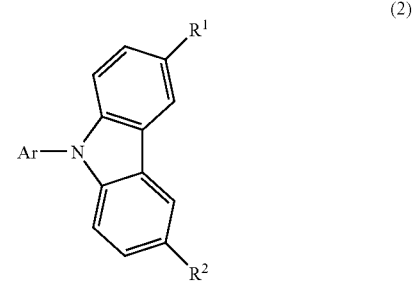

(2)

wherein Ar represents a monovalent aromatic hydrocarbon group having 6 to 42 carbon atoms,
wherein each of $R^1$ and $R^2$ represents any of hydrogen, an alkyl group having 1 to 4 carbon atoms, and an aryl group having 6 to 12 carbon atoms, and
wherein the inorganic compound is a transition metal oxide.
6. The semiconductor device according to claim 5, wherein the inorganic compound is one of vanadium oxide, tantalum oxide, molybdenum oxide, tungsten oxide, rhenium oxide, and ruthenium oxide.
7. The semiconductor device according to claim 5, wherein the semiconductor device further comprises a buffer layer being in contact with the composite layer and the semiconductor layer.
8. The semiconductor device according to claim 5, wherein the organic semiconductor material is the same as the organic compound.
9. A semiconductor device comprising:
a semiconductor layer containing an organic semiconductor material; and
a source electrode and a drain electrode,
wherein at least one of the source electrode and the drain electrode has a composite layer containing an organic compound and an inorganic compound,
wherein the organic compound and the inorganic compound are mixed in the composite layer,
wherein the organic compound is represented by a following general formula (3),

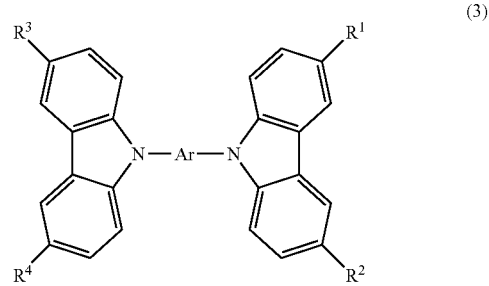

(3)

wherein Ar represents a divalent aromatic hydrocarbon group having 6 to 42 carbon atoms, wherein each of $R^1$ to $R^4$ represents any of hydrogen, an alkyl group having 1 to 4 carbon atoms, and an aryl group having 6 to 12 carbon atoms, and wherein the inorganic compound is a transition metal oxide.

10. The semiconductor device according to claim 9, wherein the inorganic compound is one of vanadium oxide, tantalum oxide, molybdenum oxide, tungsten oxide, rhenium oxide, and ruthenium oxide.

11. The semiconductor device according to claim 9, wherein the semiconductor device further comprises a buffer layer being in contact with the composite layer and the semiconductor layer.

12. The semiconductor device according to claim 9, wherein the organic semiconductor material is the same as the organic compound.

13. A semiconductor device comprising:
a semiconductor layer containing an organic semiconductor material;
a source electrode and a drain electrode,
wherein at least one of the source electrode and the drain electrode has a composite layer containing an organic compound and an inorganic compound,
wherein the organic compound and the inorganic compound are mixed in the composite layer,
wherein the organic compound is represented by a following general formula (4),

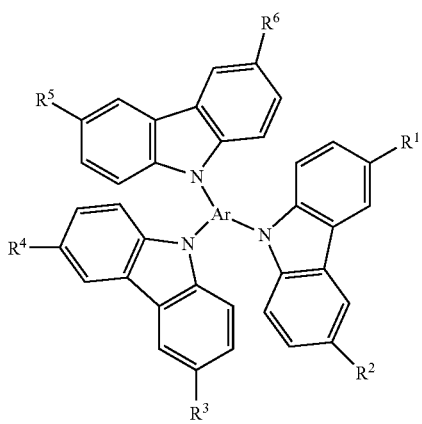

(4)

wherein Ar represents a trivalent aromatic hydrocarbon group having 6 to 42 carbon atoms, and wherein each of $R^1$ to $R^6$ represents any of hydrogen, an alkyl group having 1 to 4 carbon atoms, and an aryl group having 6 to 12 carbon atoms, and wherein the inorganic compound is a transition metal oxide.

14. The semiconductor device according to claim 13, wherein the inorganic compound is one of vanadium oxide, tantalum oxide, molybdenum oxide, tungsten oxide, rhenium oxide, and ruthenium oxide.

15. The semiconductor device according to claim 13, wherein the semiconductor device further comprises a buffer layer being in contact with the composite layer and the semiconductor layer.

16. The semiconductor device according to claim 13, wherein the organic semiconductor material is the same as the organic compound.

17. A semiconductor device comprising:
a semiconductor layer containing an organic semiconductor material; and
a source electrode and a drain electrode,
wherein at least one of the source electrode and the drain electrode has a composite layer containing an organic compound and an inorganic compound,
wherein the organic compound and the inorganic compound are mixed in the composite layer,
wherein the organic compound is an aromatic hydrocarbon, and
wherein the inorganic compound is a transition metal oxide.

18. The semiconductor device according to claim 17, wherein the inorganic compound is one of vanadium oxide, tantalum oxide, molybdenum oxide, tungsten oxide, rhenium oxide, and ruthenium oxide.

19. The semiconductor device according to claim 17, wherein the semiconductor device further comprises a buffer layer being in contact with the composite layer and the semiconductor layer.

20. The semiconductor device according to claim 17, wherein the organic semiconductor material is the same as the organic compound.

* * * * *